US008797367B2

(12) United States Patent
Mori et al.

(10) Patent No.: US 8,797,367 B2
(45) Date of Patent: Aug. 5, 2014

(54) DISPLAY DEVICE, DISPLAY DEVICE DRIVE METHOD, AND COMPUTER PROGRAM

(75) Inventors: Hideto Mori, Tokyo (JP); Ken Kikuchi, Tokyo (JP); Yasuo Inoue, Tokyo (JP); Takeya Meguro, Tokyo (JP); Hidehiko Shidara, Tokyo (JP); Masahiro Ito, Tokyo (JP); Toyo Osumi, Tokyo (JP); Eiichi Saito, Tokyo (JP)

(73) Assignee: Sony Corporation, Tokyo (JP)

( * ) Notice: Subject to any disclaimer, the term of this patent is extended or adjusted under 35 U.S.C. 154(b) by 829 days.

(21) Appl. No.: 12/663,611

(22) PCT Filed: Jun. 2, 2008

(86) PCT No.: PCT/JP2008/060150
§ 371 (c)(1),
(2), (4) Date: Dec. 8, 2009

(87) PCT Pub. No.: WO2008/149842
PCT Pub. Date: Dec. 11, 2008

(65) Prior Publication Data
US 2010/0165009 A1 Jul. 1, 2010

(30) Foreign Application Priority Data
Jun. 8, 2007 (JP) .................................. 2007-153385

(51) Int. Cl.
G09G 5/10 (2006.01)
(52) U.S. Cl.
USPC ....................................... 345/690; 315/169.3
(58) Field of Classification Search
USPC ................... 345/77, 211, 690, 691; 315/169.3
See application file for complete search history.

(56) References Cited

U.S. PATENT DOCUMENTS 6,414,661 B1 * 7/2002 Shen et al. ...................... 345/82
6,456,016 B1 * 9/2002 Sundahl et al. ............... 315/291
(Continued)

FOREIGN PATENT DOCUMENTS

EP 2 138 994 A1 12/2009
JP 03-238497 A 10/1991
(Continued)

OTHER PUBLICATIONS
Supplementary European Search Report issued Apr. 15, 2011, in European Patent Application No. 08777101.0.
(Continued)

Primary Examiner — Quan-Zhen Wang
Assistant Examiner — Calvin C Ma
(74) Attorney, Agent, or Firm — Oblon, Spivak, McClelland, Maier & Neustadt, L.L.P.

(57) ABSTRACT

A display device is provided that includes an amount of light emission computation portion that computes an amount of light emission based on a video signal that has a linear characteristic, an amount of light emission parameter computation portion that, based on the computed amount of light emission, computes an amount of light emission parameter that corresponds to the amount of light emission for each of one of one pixel and a group of pixels that includes a plurality of the pixels, an amount of light emission parameter accumulation portion that accumulates the amount of light emission parameters in association with the one of the one pixel and the group of pixels, a peak detection portion that detects a peak value among the accumulated amount of light emission parameters that correspond to all of the one of the one pixel and the group of pixels, a coefficient computation portion that, based on the detected peak value, computes a coefficient that adjusts a luminance, and a coefficient multiplying portion that multiplies the video signal by the computed coefficient and outputs the multiplied video signal.

20 Claims, 29 Drawing Sheets

(56) References Cited

U.S. PATENT DOCUMENTS

| | | |
|---|---|---|
| 7,355,574 B1 * | 4/2008 | Leon et al. ............... 345/82 |
| 7,640,362 B2 * | 12/2009 | Brooks et al. .............. 709/247 |
| 2003/0063053 A1 | 4/2003 | Yamazaki et al. |
| 2005/0285828 A1 | 12/2005 | Inoue et al. |
| 2006/0055335 A1 * | 3/2006 | Shingai et al. .......... 315/169.3 |
| 2007/0097038 A1 | 5/2007 | Yamazaki et al. |
| 2007/0279372 A1 * | 12/2007 | Brown et al. ............. 345/102 |
| 2008/0266332 A1 | 10/2008 | Inoue et al. |
| 2010/0123740 A1 | 5/2010 | Inoue et al. |

FOREIGN PATENT DOCUMENTS

| | | |
|---|---|---|
| JP | 10 254410 | 9/1998 |
| JP | 10-254410 A | 9/1998 |
| JP | 2002-116728 A | 4/2002 |
| JP | 2003 177713 | 6/2003 |
| JP | 2003-177713 A | 6/2003 |
| JP | 2003-280592 A | 10/2003 |
| JP | 2004-151557 A | 5/2004 |
| JP | 2005 275181 | 10/2005 |
| JP | 2005-346032 A | 12/2005 |
| JP | 2005-539252 A | 12/2005 |
| JP | 2006 47617 | 2/2006 |
| JP | 2006 119465 | 5/2006 |
| JP | 2006 163069 | 6/2006 |
| JP | 2006-163069 A | 6/2006 |

OTHER PUBLICATIONS

Office Action issued Jun. 4, 2013 in Japanese Office Action No. 2009-517860.

* cited by examiner

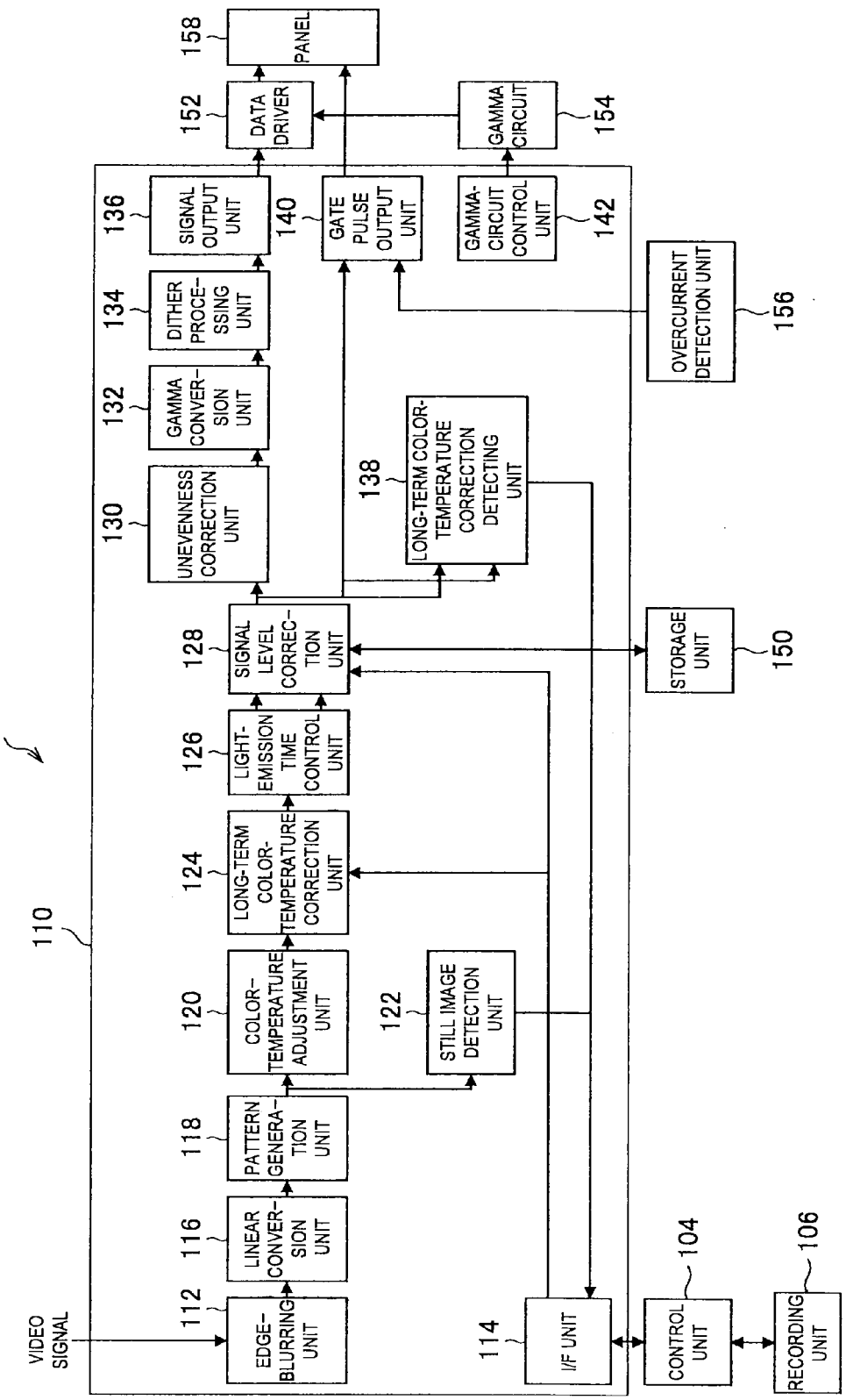

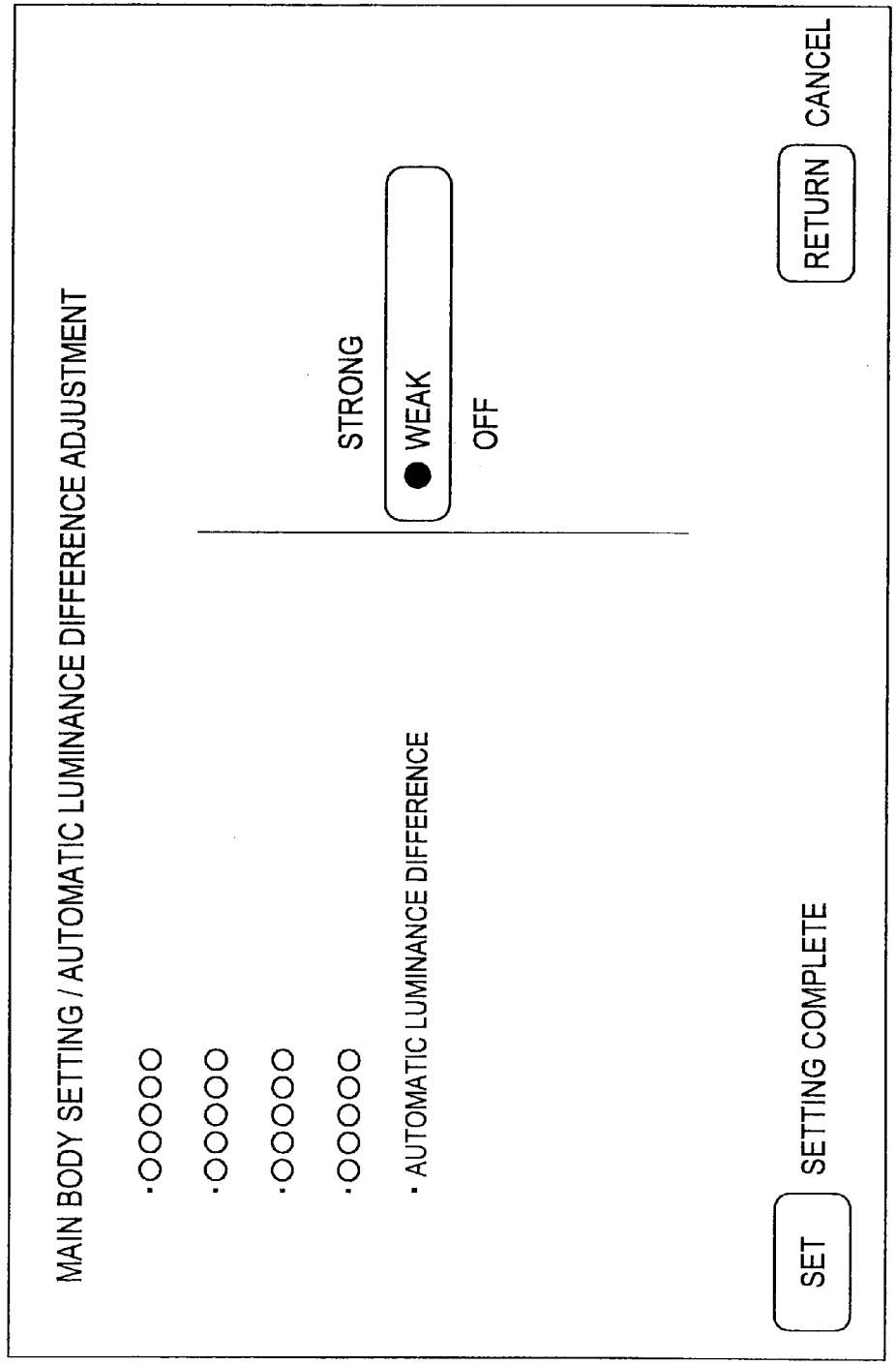

DISPLAY DEVICE, DISPLAY DEVICE DRIVE METHOD, AND COMPUTER PROGRAM

TECHNICAL FIELD

The present invention relates to a display device and a display device drive method, and more particularly, to an active matrix type display device that is configured such that scanning lines for selecting pixels in a predetermined scan cycle, data lines that provide luminance information for driving the pixels, and pixel circuits for controlling a data amount based on the luminance information and causing light emitting elements to emit light according to the data amount are arranged in a matrix configuration, as well as a drive method for the display device.

BACKGROUND ART

Liquid crystal display devices that use liquid crystals and plasma display devices that use plasma have found practical application as flat and thin display devices.

A liquid crystal display device provides a backlight, and displays images by altering an array of liquid crystal molecules by application of voltage, passing or blocking light from the backlight. Additionally, a plasma display device causes a plasma state to occur by application of voltage to a gas that is enclosed within a panel, and ultraviolet light produced by energy occurring on return from the plasma state to the original state becomes visible light through irradiation of a fluorescent body, displaying an image.

Meanwhile, in recent years, development has been progressing for self-illuminating type displays employing organic electroluminescent (EL) elements in which the element itself emits light when voltage is applied. When the organic EL element receives energy by electrolysis, it changes from a base state to an excited state, and at the time of return from the excited state to the base state, the difference in energy is emitted as light. The organic EL display device is a display device that displays images using these organic EL elements.

A self-illuminating type display device, unlike a liquid crystal display device, which requires a backlight, requires no backlight because the elements themselves emit light, and thus it is possible to make the structure thin compared to a liquid crystal display device. Additionally, because motion characteristics, viewing angle characteristics, color reproduction performance, and the like are superior to a liquid crystal display device, organic EL display devices are attracting attention as next-generation flat and thin display devices.

However, the light-emitting characteristics of the organic EL element deteriorate if the voltage continues to be applied, such that the luminance diminishes even if the same electric current is input. This means that in a case where light is emitted very frequently from a specific pixel, the light-emitting characteristics of the specific pixel will deteriorate more than those of other pixels, giving rise to a problem that is known as the burn-in phenomenon.

The burn-in phenomenon can also occur in the liquid crystal display device and the plasma display device, but because those display devices display images by applying alternating current voltages, they require units that regulate the voltages that are applied. In contrast, in the self-illuminating type display device, a method is used that compensates for the burn-in by controlling the amount of electric current. Patent Document 1 is an example of a document that discloses a technology for that compression for the burn-in in the self-illuminating type display device.

Patent Document 1: Japanese Patent Application Publication JP-A-2005-275181

DISCLOSURE OF THE INVENTION

However, in the method that is disclosed in Patent Document 1, the control is performed such that the cumulative amount of light that is emitted by one of each pixel and each sub-pixel is uniform, so that the value that is assigned to a portion of a light-emitting body where there is little deterioration is greater than the basic input data It is therefore possible to achieve a balance in the amount of light that is emitted, but a problem is created in that the deterioration of the light-emitting body proceeds more quickly, and the lifetime of the light-emitting body is shortened.

Accordingly, the present invention addresses the problems that are described above and provides a display device, a display device drive method, and a computer program that are new and improved and that, in a display device that has a light emitting element that emits light in accordance with an amount of electric current as in the organic EL display device, are capable of inhibiting the burn-in phenomenon on the screen by computing an amount of light that is emitted based on a video signal and by controlling the video signal.

In order to address the problems that are described above, according to an aspect of the present invention, a display device is provided that includes a display portion in which a plurality of pixels that have light emitting elements that emit light in accordance with an amount of electric current are arranged in the form of a matrix, scanning lines that supply to the pixels, in a specified scan cycle, selection signals that select the pixels that will emit light, and data lines that supply video signals to the pixels. The display device also includes a storage portion that stores data that pertain to amounts of light emission that correspond to a plurality of positions in the display portion and that are accumulated based on the video signals for a plurality of frames, and a luminance control portion that performs control based on a peak value of the data that pertain to the amounts of light emission and are stored in the storage portion, such that maximum luminances of the video signals that are supplied to the display portion are restricted.

According to this configuration, the storage portion stores the data that pertain to the amounts of light emission that correspond to the plurality of positions in the display portion and that are accumulated based on the video signals for the plurality of frames, and the luminance control portion performs control based on the peak value of the data that pertain to the amounts of light emission and are stored in the storage portion, such that the maximum luminances of the video signals that are supplied to the display portion are restricted. This configuration makes it possible for the amounts of light emission to be accumulated based on the video signals and for the burn-in phenomenon on the screen to be inhibited by controlling the video signals based on the accumulated amounts of light emission.

The luminance control portion may also include an amount of light emission computation portion that accepts as input a video signal that has a linear characteristic and computes an amount of light emission for each of one of one of the pixels and a group of the pixels that includes a plurality of the pixels, an amount of light emission parameter computation portion that, based on the amount of light emission that is computed by the amount of light emission computation portion, computes an amount of light emission parameter that corresponds to the amount of light emission for each of the one of one of the pixels and the group of the pixels, a peak detection portion that detects a peak value among the amount of light emission parameters that correspond to all of the one of one of the pixels and the group of the pixels and that are accumulated in the storage portion, a coefficient computation portion that, based on the peak value that is detected by the peak detection portion, computes a coefficient that adjusts a luminance, and a coefficient multiplying portion that multiplies the video signal by the coefficient that is computed by the coefficient computation portion and outputs the multiplied video signal.

According to this configuration, the amount of light emission computation portion accepts as input the video signal that has the linear characteristic and computes the amount of light emission for each of the one of one of the pixels and a group of the pixels that includes the plurality of the pixels, the amount of light emission parameter computation portion, based on the amount of light emission that is computed by the amount of light emission computation portion, computes the amount of light emission parameter that corresponds to the amount of light emission for each of the one of one of the pixels and the group of the pixels, an amount of light emission parameter accumulation portion accumulates, in association with one of one of the pixels and a group of the pixels, the amount of light emission parameters that are computed by the amount of light emission parameter computation portion, the peak detection portion detects the peak value among the amount of light emission parameters that correspond to all of the one of one of the pixels and the group of the pixels and that are accumulated in the amount of light emission parameter accumulation portion, the coefficient computation portion, based on the peak value that is detected by the peak detection portion, computes the coefficient that adjusts the luminance, and the coefficient multiplying portion multiplies the video signal by the coefficient that is computed by the coefficient computation portion and outputs the multiplied video signal. This configuration makes it possible for the burn-in phenomenon on the screen to be inhibited by computing the coefficient that adjusts the luminance for the one of one of the pixels and the group of the pixels for which the value of the accumulated amount of light emission parameters is the highest and by multiplying the video signal by the coefficient.

The display device may also include a linear conversion portion that converts a video signal that has a gamma characteristic into a video signal that has a linear characteristic. The linear conversion portion converts the video signal that has the gamma characteristic into the video signal that has the linear characteristic. This makes it possible for various types of signal processing of the video signal to be performed easily.

The display device may also include a gamma conversion portion that converts an output signal from the coefficient multiplying portion that has a linear characteristic such that it has a gamma characteristic.

According to this configuration, the gamma conversion portion converts the output signal from the coefficient multiplying portion that has the linear characteristic such that it has the gamma characteristic. Because the video signal has the gamma characteristic, it is possible for the gamma characteristic that the display portion has to be canceled and for the display portion to have the linear characteristic such that self-illuminating type elements in the interior of the display portion emit light in accordance with the electric current of the signal.

The coefficient computation portion may also compute at least a first coefficient that restricts the maximum luminances and a second coefficient that restricts a luminance of the one of one of the pixels and the group of the pixels that has the peak value, such that the luminance of the one of one of the pixels and the group of the pixels that has the peak value is less than the luminance of another of the pixels. This makes it possible for a natural image to be displayed on the display device, without excessively reducing the luminance of one part of the screen, by reducing the luminance of the entire screen and also reducing the luminance of the one of one of the pixels and the group of the pixels that has the peak value of the amount of light emission parameters.

The coefficient multiplying portion may also multiply the video signals that are input to all of the pixels by the first coefficient and multiply the video signals that have been multiplied by the first coefficient and that are input to the one of one of the pixels and the group of the pixels that has the peak value by the second coefficient. The coefficient multiplying portion may also multiply the video signals that are input to all of the pixels except the one of one of the pixels and the group of the pixels that has the peak value by the first coefficient and multiply the video signals that are input to the one of one of the pixels and the group of the pixels that has the peak value by the second coefficient.

The display device may also include a setting switching portion that switches whether the coefficient that is computed by the coefficient computation portion is used. The display device may also include a display control portion that causes to be displayed a screen for the switching by the setting switching portion of whether the coefficient is used. This makes it possible for the setting to be switched and the image to be displayed based on the video signal in a case where it is not desired to reduce the luminance in order to inhibit burn-in. It also makes it possible to perform the switching of the setting by displaying the screen on the display device.

The display device may also include a setting switching portion that switches whether the first coefficient and the second coefficient that are computed by the coefficient computation portion are used. The display device may also include a display control portion that causes to be displayed a screen for the switching by the setting switching portion of whether the first coefficient and the second coefficient are used. This makes it possible for the setting to be switched and the image to be displayed based on the video signal in a case where it is not desired to reduce the luminance in order to inhibit burn-in. It also makes it possible to perform the switching of the setting by displaying the screen on the display device.

The coefficient computation portion may also compute the coefficient based on an average value of the amounts of light emission for pixels that are contained in a specified area that surrounds the one of one of the pixels and the group of the pixels that has the peak value.

Further, in order to address the problems that are described above, according to another aspect of the present invention, a drive method is provided for a display device that includes a display portion in which a plurality of pixels that have light emitting elements that emit light in accordance with an amount of electric current are arranged in the form of a matrix, scanning lines that supply to the pixels, in a specified scan cycle, selection signals that select the pixels that will emit light, and data lines that supply video signals to the pixels. The drive method includes a step of storing data that pertain to amounts of light emission that correspond to a plurality of positions in the display portion and that are accumulated based on the video signals for a plurality of frames and also includes a step of performing control based on a peak value of the stored data that pertain to the amounts of light emission, such that maximum luminances of the video signals that are supplied to the display portion are restricted.

According to this configuration, the data that pertain to the amounts of light emission that correspond to the plurality of positions in the display portion and that are accumulated based on the video signals for the plurality of frames are stored, and control is performed based on the peak value of the stored data that pertain to the amounts of light emission, such that the maximum luminances of the video signals that are supplied to the display portion are restricted. This makes it possible for the amounts of light emission to be accumulated based on the video signals and for the burn-in phenomenon on the screen to be inhibited by controlling the video signals based on the accumulated amounts of light emission.

Additionally, in order to address the problems that are described above, according to another aspect of the present invention, a computer program is provided that causes a computer to perform control of a display device that includes a display portion in which a plurality of pixels that have light emitting elements that emit light in accordance with an amount of electric current are arranged in the form of a matrix, scanning lines that supply to the pixels, in a specified scan cycle, selection signals that select the pixels that will emit light, and data lines that supply video signals to the pixels. The computer program includes a step of storing data that pertain to amounts of light emission that correspond to a plurality of positions in the display portion and that are accumulated based on the video signals for a plurality of frames and also includes a step of performing control based on a peak value of the stored data that pertain to the amounts of light emission, such that maximum luminances of the video signals that are supplied to the display portion are restricted.

According to this configuration, the data that pertain to the amounts of light emission that correspond to the plurality of positions in the display portion and that are accumulated based on the video signals for the plurality of frames are stored, and control is performed based on the peak value of the stored data that pertain to the amounts of light emission, such that the maximum luminances of the video signals that are supplied to the display portion are restricted. This makes it possible for the amounts of light emission to be accumulated based on the video signals and for the burn-in phenomenon on the screen to be inhibited by controlling the video signals based on the accumulated amounts of light emission.

According to the present invention that is described above, a display device, a display device drive method, and a computer program can be provided that are new and improved and that, in a display device that has a light emitting element that emits light in accordance with an amount of electric current as in the organic EL display device, are capable of inhibiting the burn-in phenomenon on the screen by detecting and electric current amount and controlling the electric current amount

BRIEF DESCRIPTION OF THE DRAWINGS

FIG. 1 is an explanatory diagram that explains the structure of a display device 100 according to an embodiment of the present invention.

FIG. 24 is an explanatory figure that shows an example of a screen for making a luminance adjustment setting according to a third embodiment of the present invention.

Figure 2A:
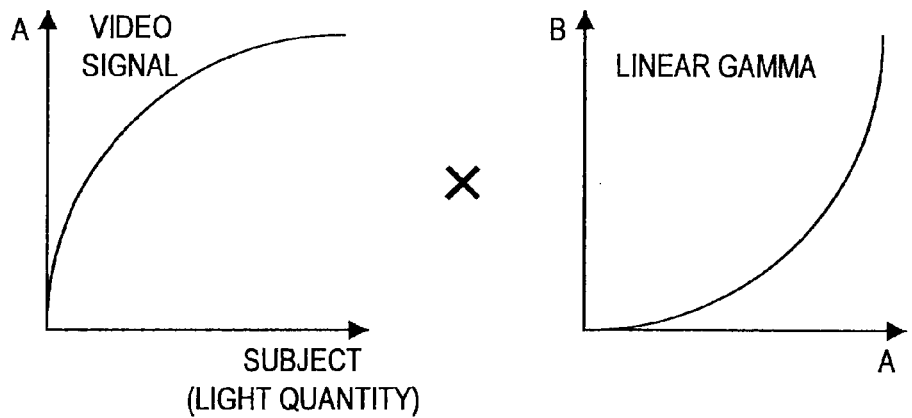
FIG. 2A is an explanatory diagram that explains, in the form of a graph, a transition in a characteristic of a signal that flows in the display device 100 according to the embodiment of the present invention.

DESCRIPTION OF REFERENCE NUMERALS 100 display device
104 control unit
106 recording unit
110 signal processing integrated circuit
112 edge blurring unit
114 I/F unit
116 linear conversion unit
118 pattern generation unit
120 color temperature adjustment unit
122 still image detection unit
124 long-term color temperature correction unit
126 light emission time control unit
128 signal level correction unit
130 unevenness correction unit
132 gamma conversion unit
134 dither processing unit
136 signal output unit
138 long-term color temperature correction detection unit
140 gate pulse output unit
142 gamma circuit control unit
150 storage unit
152 data driver
154 gamma circuit
156 overcurrent detection unit
158 panel
162 luminance computation unit
164 amount of light emission computation unit
166 risk level computation unit
168 risk level update unit
170 peak detection unit
172, 272 gain computation unit
174 multiplier
265 area average computation unit

BEST MODE FOR CARRYING OUT THE INVENTION

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

First Embodiment

First, a structure of a display device according to a first embodiment of the present invention is described. FIG. 1 is an explanatory diagram that explains the structure of a display device 100 according to the first embodiment of the present invention. The structure of the display device 100 according to the first embodiment of the present invention is described below with reference to FIG. 1.

As shown in FIG. 1, the display device 100 according to the first embodiment of the present invention includes a control unit 104, a recording unit 106, a signal processing integrated circuit 110, a storage unit 150, a data driver 152, a gamma circuit 154, an overcurrent detection unit 156, and a panel 158.

The signal processing integrated circuit 110 includes an edge blurring unit 112, an I/F unit 114, a linear conversion unit 116, a pattern generation unit 118, a color temperature adjustment unit 120, a still image detection unit 122, a long-term color temperature connection unit 124, a light emission time control unit 126, a signal level correction unit 128, an unevenness correction unit 130, a gamma conversion unit 132, a dither processing unit 134, a signal output unit 136, a long-term color temperature correction detection unit 138, a gate pulse output unit 140, and a gamma circuit control unit 142.

When receiving a video signal, the display device 100 analyzes the video signal, and turns on pixels arranged in the panel 158, mentioned later, according to the analyzed contents, so as to display a video through the panel 158.

The control unit 104 controls the signal processing integrated circuit 110 and sends and receives signals to and from the I/F unit 114. Additionally, the control unit 104 executes various signal processing on the signals received from the I/F unit 114. The signal processing executed in the control unit 104 includes, for example, calculation of gain to be used for adjusting luminance of an image displayed on the panel 158.

The recording unit 106 is for storing information for controlling the signal processing integrated circuit 110 in the control unit 104 therein. A memory that can store information without deletion of the information even if power of the display device 100 is turned off is preferably used as the recording unit 106. An EEPROM (Electronically Erasable and Programmable Read Only Memory) that can rewrite contents electronically is desirably used as the memory that is adopted as the recording unit 106. The EEPROM is a non-volatile memory which can write or delete data with the EEPROM being packaged on a substrate, and is suitable for storing information of the display device 100 that changes moment by moment.

The signal processing integrated circuit 110 inputs a video signal and executes signal processing with respect to the input video signal. In the present embodiment, the video signal input into the signal processing integrated circuit 110 is a digital signal, and signal width is 10 bits. The signal processing to be executed on the input video signal is executed in the respective sections in the signal processing integrated circuit 110.

The edge blurring unit 112 executes signal processing for blurring an edge on the input video signal. Specifically, the edge blurring unit 112 intentionally shifts an image and blurs its edge so as to prevent a phenomenon of burn-in of the image onto the panel 158.

The linear conversion unit 116 executes signal processing for converting a video signal whose output with respect to an input has a gamma characteristic into a video signal having a linear characteristic. When the linear conversion unit 116 executes the signal processing so that the output with respect to the input has the linear characteristic, various processing with respect to images displayed on the panel 158 becomes easy. The signal processing in the linear conversion unit 116 widens the signal width of the video signal from 10 bits to 14 bits. Once the video signal has been converted by the linear conversion unit 116 such that it has the linear characteristic, it is converted in the gamma conversion unit 132, which is described later, such that it has the gamma characteristic.

The pattern generation unit 118 generates test patterns to be used in the image processing inside the display device 100. The test patterns to be used in the image processing in the display device 100 include, for example, a test pattern which is used for display inspection of the panel 158.

The color temperature adjustment unit 120 adjusts color temperature of images, and adjusts colors to be displayed on the panel 158 of the display device 100. Although not shown in FIG. 1, the display device 100 includes color temperature adjusting section which adjusts color temperature, and when a user operates the color temperature adjusting section, color temperature of images to be displayed on the screen can be adjusted manually.

The long-term color temperature correction unit 124 corrects deterioration with age due to variation in luminance/time characteristic (LT characteristic) of respective colors R (red), G (green), and B (blue) of organic EL elements. Because the organic EL elements have different LT characteristics of R, (and B, color balance deteriorates over light emission time. The long-term color temperature correction unit 124 corrects the color balance.

The light emission time control unit 126 calculates a duty ratio of a pulse at the time of displaying an image on the panel 158, and controls the light emission time of the organic EL elements. The display device 100 applies an electric current to the organic EL elements in the panel 158 while the pulse is in a HI state, so as to cause the organic EL elements to emit light and display an image.

The signal level correction unit 128 corrects the level of the video signal and adjusts the luminance of the video to be displayed on the panel 158 in order to prevent an image burn-in phenomenon. In the image burn-in phenomenon, deterioration of light emission characteristics occurs in a case where the light emission frequency of a specific pixel is high compared to other pixels, leading to a decline in luminance of the pixel that has deteriorated compared with other pixels which have not deteriorated, and the difference in luminance with the surrounding portion which has not deteriorated becomes larger. Due to this difference in luminance, text appears to be burned into the screen.

The signal level correction unit 128 calculates the amount of light emission of respective pixels or a pixel group based on the video signal and the duty ratio of the pulse calculated by the light emission time control unit 126, and calculates gain for reducing the luminance according to need based on the calculated amount of luminance, so as to multiply the video signal by the calculated gain. A configuration of the signal level correction unit 128 will be described in detail later.

The long-term color temperature correction detection unit 138 detects information for correction in the long-term color temperature correction unit 124. The information detected by the long-term color temperature correction detection unit 138 is sent to the control unit 104 via the I/F unit 114, and is recorded in the recording unit 106 via the control unit 104.

The unevenness correction unit 130 corrects unevenness of images and videos displayed on the panel 158. In the unevenness correction unit 130, horizontal stripes and vertical stripes of the panel 158 and unevenness of the entire screen are corrected based on the level of an input signal and a coordinate position.

The gamma conversion unit 132 executes signal processing for converting the video signal converted into a signal having a linear characteristic by the linear conversion unit 116 into a signal having a gamma characteristic. The signal processing executed in the gamma conversion unit 132 is signal processing for canceling the gamma characteristic of the panel 158 and converting a signal into a signal having a linear characteristic so that the organic EL elements in the panel 158 emit light according to the electric current of the signal. When the gamma conversion unit 132 performs the signal processing, the signal width changes from 14 bits to 12 bits.

The dither processing unit 134 executes dithering with respect to the signal converted by the gamma conversion unit 132. The dithering provides display where displayable colors are combined in order to express medium colors in an environment in which the number of usable colors is small. By executing dithering by the dither processing unit 134, colors which intrinsically cannot be displayed on the panel can be simulated and expressed. The signal width is changed from 12 bits to 10 bits by the dithering in the dither processing unit 134.

The signal output unit 136 outputs the signal after dithering by the dither processing unit 134 to the data driver 152. The signal sent from the signal output unit 136 to the data driver 152 is a signal multiplied by information about the amount of light emission of respective colors R, Q and B, and the signal multiplied by the information about the light emission time is output in the form of a pulse from the gate pulse output unit 140.

The gate pulse output unit 140 outputs a pulse for controlling the light emission time of the panel 158. The pulse output from the gate pulse output unit 140 is a pulse calculated by the light emission time control unit 126 based on the duty ratio. The pulse from the gate pulse output unit 140 determines the light emission time of each pixel on the panel 158.

The gamma circuit control unit 142 gives a setting value to the gamma circuit 154. The setting value that is given by the gamma circuit control unit 142 is a reference voltage to be given to ladder resistance of a D/A converter contained inside the data driver 152.

The storage unit 150 is an example of a parameter accumulation portion of the present invention, and it stores, in association with one another, information on one of a pixel and a group of pixels that emits light that exceeds a specified luminance and information on an amount by which the specified luminance is exceeded. The two types of information become necessary when a luminance is corrected in the signal level correction unit 128. Unlike the recording unit 106, a memory in which contents are deleted when the power is turned off may be used as the storage unit 150, and, for example, SDRAM (Synchronous Dynamic Random Access Memory) is desirably used as such a memory.

In a case where an overcurrent is produced by substrate short circuit or the like, the overcurrent detection unit 156 detects the overcurrent and notifies the gate pulse output unit 140. In a case where an overcurrent is produced, the overcurrent detection and notification by the overcurrent detection unit 156 can prevent the overcurrent from being applied to the panel 158.

The data driver 152 executes signal processing with respect to the signal received from the signal output unit 136, and outputs a signal for displaying video on the panel 158 to the panel 158. The data driver 152 includes a D/A converter that is not shown in the drawings, and the D/A converter converts a digital signal into an analog signal and outputs the analog signal.

The gamma circuit 154 gives a reference voltage to the ladder resistance of the D/A converter contained inside the data driver 152. The reference voltage to be given to the ladder resistance is generated by the gamma circuit control unit 142.

The panel 158 accepts as inputs an output signal from the data driver 152 and an output pulse from the gate pulse output unit 140, causing the organic EL elements, which are examples of self-illuminating type elements, to emit light to display moving images and still images according to the signal and the pulse that are input. In the panel 158, the shape of the surface that displays the images is a plane. The organic EL elements are self-illuminating type elements which emit light when a voltage is applied, and their amount of light emission is proportional to the voltage. Consequently, an IL characteristic (current/light emission amount characteristic) of the organic EL elements also comes to have a proportional relationship.

In the panel 158, not shown in the figure, scanning lines that select pixels in a predetermined scanning cycle, data lines that give luminance information for driving the pixels, and pixel circuits that control the amount of electric current based on the luminance information and cause the organic EL elements as light emitting elements to emit light according to the amount of electric current, are structured by arrangement in a matrix pattern, and the structuring of the scanning lines, the data lines, and the pixel circuits in this way enables the display device 100 to display video images in accordance with a video signal.

The structure of the display device 100 according to the first embodiment of the present invention has been described above with reference to FIG. 1. The display device 100 according to the first embodiment of the present invention depicted in FIG. 1 converts a video signal to a signal having a linear characteristic using the linear conversion unit 116 and thereafter inputs the converted video signal into the pattern generation unit 118, but the pattern generation unit 118 and the linear conversion unit 116 may be interchanged.

Next, a characteristic transition of a signal flowing in the display device 100 according to the embodiment of the present invention is described below. FIGS. 2A through 2F are explanatory diagrams that explain, in the form of graphs, transitions in characteristics of the signal that flows in the display device 100 according to the first embodiment of the present invention. In the respective graphs in FIGS. 2A to 2F, the horizontal axis represents input and the vertical axis represents output.

FIG. 2A illustrates that when a subject is input, the linear conversion unit 116 multiplies a video signal whose output A with respect to the light quantity of the subject has a gamma characteristic by an inverse gamma curve (linear gamma) so as to convert the video signal into a video signal whose output with respect to the light quantity of the subject has a linear characteristic.

Figure 2B:
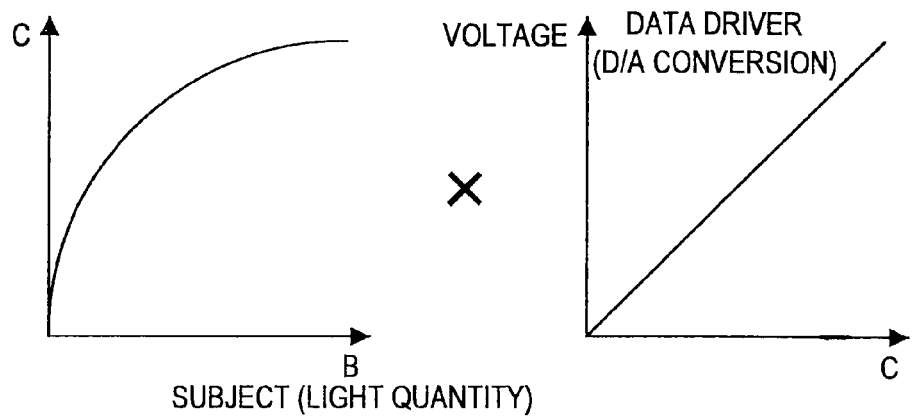
FIG. 2B is an explanatory diagram that explains, in the form of a graph, a transition in a characteristic of the signal that flows in the display device 100 according to the embodiment of the present invention.

FIG. 2B illustrates that the gamma conversion unit 132 multiplies a video signal converted so that an output B with respect to the input of the light quantity of the subject has a linear characteristic by a gamma curve, so as to convert the video signal into a video signal whose output with respect to the input of the light quantity of the subject has a gamma characteristic.

Figure 2C:
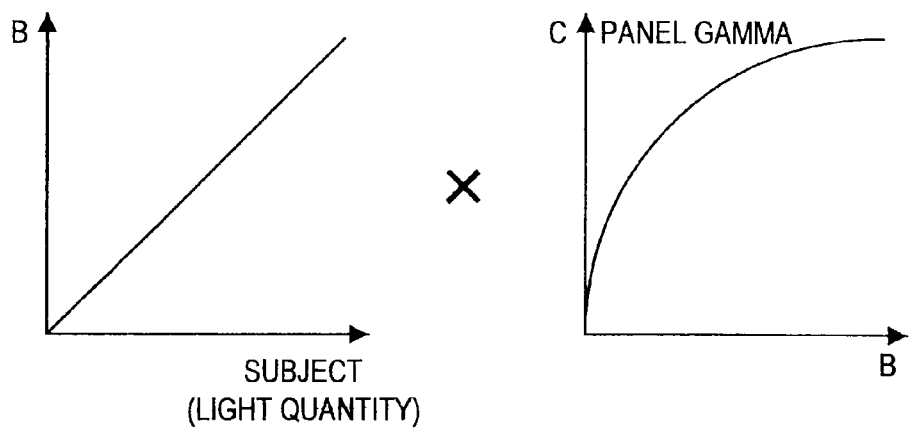
FIG. 2C is an explanatory diagram that explains, in the form of a graph, a transition in a characteristic of the signal that flows in the display device 100 according to the embodiment of the present invention.

FIG. 2C illustrates that the data driver 152 performs D/A conversion of a video signal, which is converted so that an output C with respect to the input of the light quantity of the subject has the gamma characteristic, into an analog signal. In the D/A conversion, a relationship between input and output has the linear characteristic. Consequently, the data driver 152 performs D/A conversion on a video signal, and when the light quantity of the subject is input, an output voltage has the gamma characteristic.

Figure 2D:
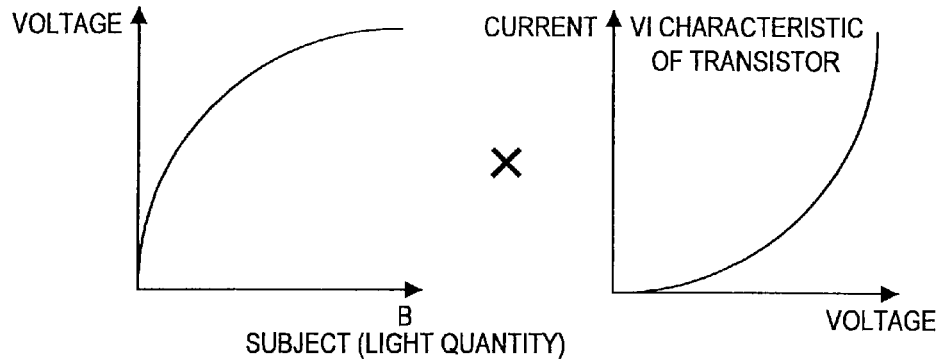
FIG. 2D is an explanatory diagram that explains, in the form of a graph, a transition in a characteristic of the signal that flows in the display device 100 according to the embodiment of the present invention.

FIG. 2D illustrates that when the video signal which was subject to the D/A conversion is input into a transistor included in the panel 158, both gamma characteristics are canceled. The VI characteristic of the transistor is the gamma characteristic which has a curve inverse to a gamma characteristic of the output voltage with respect to the input of the light quantity of the subject. Consequently, when the light quantity of the subject is input, the conversion can be again carried out so that the output current has a linear characteristic.

Figure 2E:
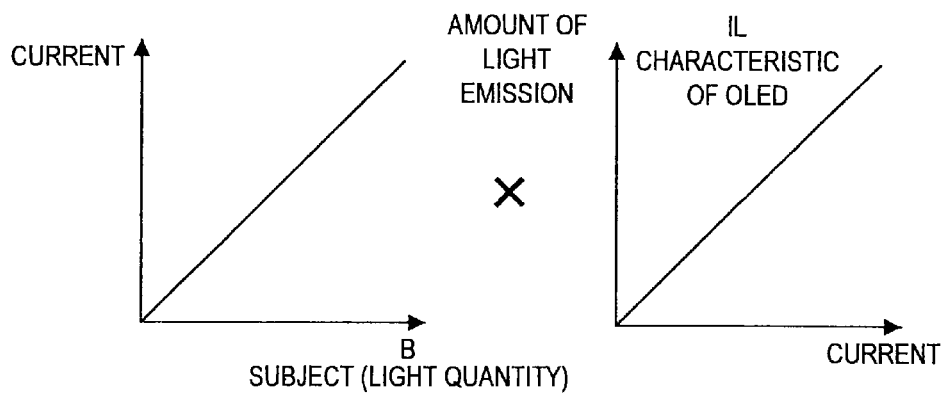
FIG. 2E is an explanatory diagram that explains, in the form of a graph, a transition in a characteristic of the signal that flows in the display device 100 according to the embodiment of the present invention.

FIG. 2E illustrates that when the light quantity of the subject is input, the signal whose output current has a linear characteristic is input into the panel 158, and the signal having the linear characteristic is multiplied by the IL characteristic of the organic EL elements having the linear characteristic.

Figure 2F:
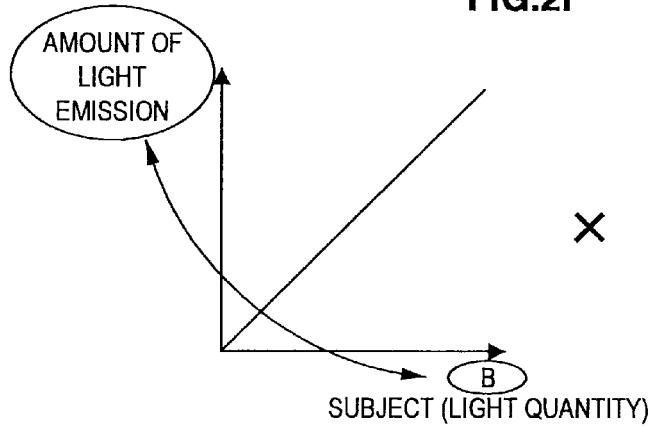
FIG. 2F is an explanatory diagram that explains, in the form of a graph, a transition in a characteristic of the signal that flows in the display device 100 according to the embodiment of the present invention.

As a result, as shown in FIG. 2F, when the light quantity of the subject is input, the amount of light emission of the panel (OLED; Organic Light Emitting Diode) has the linear characteristic, and thus by converting the video signal in the linear conversion unit 116 so as to have a linear characteristic, it becomes possible to perform signal processing on the interval to the gamma conversion unit 132 from the linear conversion unit 116 in the signal processing integrated circuit 110 shown in FIG. 1 as a linear region.

The characteristic transitions of the signals flowing in the display device 100 according to the embodiment of the present invention have been described above.

Pixel Circuit Structure

Next, one example of the structure of the pixel circuit disposed in the panel 158 that is shown in FIG. 1 will be described.

Figure 3:
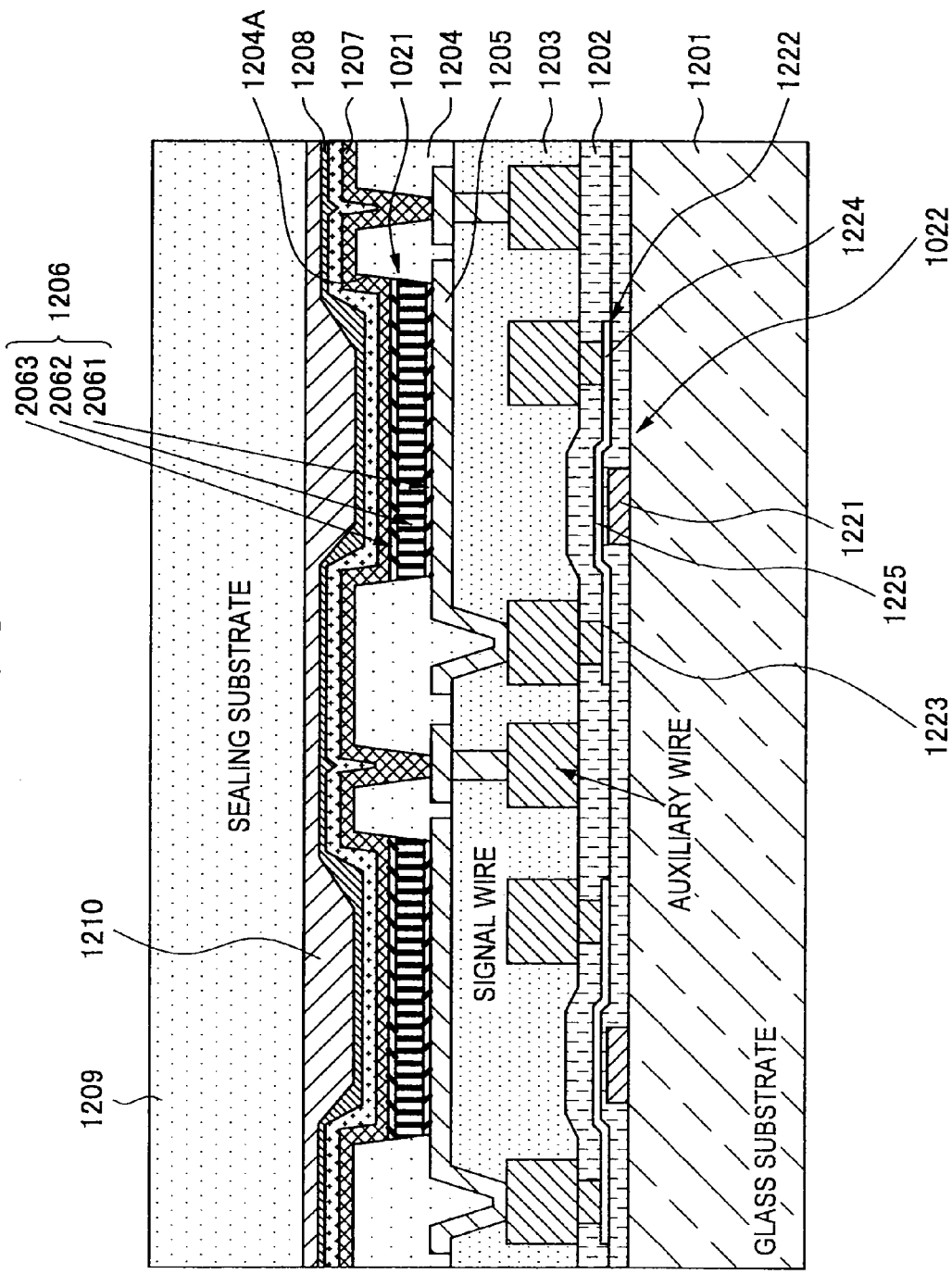
FIG. 3 is a sectional view that shows an example of cross-sectional structure of a pixel circuit that is provided in a panel 158.

FIG. 3 is a cross-sectional view depicting one example of cross-sectional structure of the pixel circuit disposed in the panel 158 that is shown in FIG. 1. As shown in FIG. 3, the pixel circuit disposed in the panel 158 has a structure in which an insulation film 1202, an insulation leveling film 1203, and a window insulation film 1204 are formed in that order on a glass substrate 1201 in which is formed a drive circuit including a drive transistor 1022 and the like, and an organic EL element 1021 is disposed in a concavity 1204A in the window insulation film 1204. Here, of the respective structural elements of the drive circuit, only the drive transistor 1022 is depicted, and indication of other structural elements is omitted.

The organic EL element 1021 is made up of an anode electrode 1205 composed of metal or the like formed on a bottom portion of the concavity 1204A in the window insulation film 1205, an organic layer (electron transport layer, light emission layer, and hole transport layer/hole implantation layer) 1206 formed on the anode electrode 1206, and a cathode electrode 1207 made up of a transparent conductive film or the like formed commonly on all pixels on the organic layer 1206.

In this organic EL element 1021, the organic layer 1206 is formed by sequentially depositing a hole transport layer/hole implantation layer 2061, a light emission layer 2062, an electron transport layer 2063, and an electron implantation layer (not illustrated) on the anode electrode 1205. Accordingly, light is emitted when electrons and holes in the light emission layer 2062 in the organic layer 1206 electron hole recombine due to current flowing from the drive transistor 1022 via the anode electrode 1205 to the organic layer 1206, under current drive by the drive transistor 1022.

The drive transistor 1022 is made up of a gate electrode 1221, a source/drain region 1223 disposed on one side of a semiconductor layer 1222, a drain/source region 1224 disposed on the other side of the semiconductor layer 1227, and a channel forming region 1225 of a portion facing the gate electrode 1221 of the semiconductor layer 1222. The source/drain region 1223 is electrically connected to the anode electrode 1205 of the organic EL element 1021 via a contact hole.

Accordingly, as shown in FIG. 3, after the organic EL element 1021 has been formed in pixel units, via the insulation film 1202, the insulation leveling film 1203, and the window insulation film 1204, on the glass substrate 1201 in which is formed the drive circuit including the drive transistor 1022, a sealing substrate 1209 is attached by an adhesive 1210 via a passivation film 1208, and the organic EL element 1021 is sealed by the sealing substrate 1209, forming the panel 158.

Drive Circuit

Next, one example of the structure of the drive circuit disposed in the panel 158 that is shown in FIG. 1 will be described.

Figure 4:
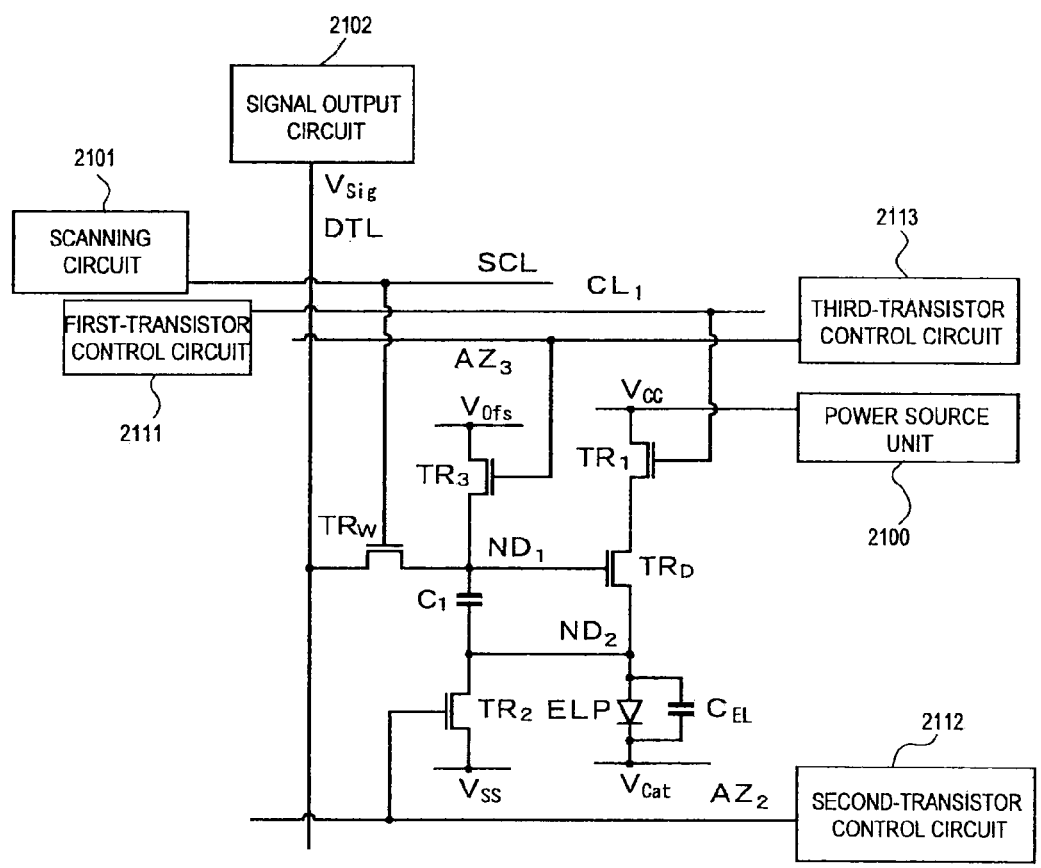
FIG. 4 is an equivalent circuit diagram of a 5Tr/1C drive circuit

Various circuits that are shown in FIG. 4 and the like exist as drive circuits for driving a light emission unit ELP provided with organic EL elements, but items common to a drive circuit fundamentally made up of five transistors/one capacitor (which hereinafter may in some cases be called a 5Tr/1C drive circuit), a drive circuit fundamentally made up of four transistors/one capacitor (which hereinafter may in some cases be called a 4Tr/1C drive circuit), a drive circuit fundamentally made up of three transistors/one capacitor (which hereinafter may in some cases be called a 3Tr/1C drive circuit), and a drive circuit fundamentally made up of two transistors/one capacitor (which hereinafter may in some cases be called a 2Tr/1C drive circuit) will firstly be explained below.

For convenience, each transistor constituting a drive circuit is, in principle, described as being made up of an n-channel type thin film transistor (WI). Note, however, that depending on the case, a portion of the transistors can also be made up of p-channel type TFTs. Note that a structure in which transistors are formed on a semiconductor substrate or the like can also be used. The structure of the transistors constituting the drive circuit is not particularly limited. In the explanation below, transistors constituting drive circuits are described as being of enhancement type, but are not limited to this. Depression type transistors may be used Additionally, transistors constituting a drive circuit may be of single-gate type, or may be of dual-gate type.

In the explanation below, a display device is made up of (N/3)×M pixels arranged in a two-dimensional matrix pattern, and one pixel is taken to be made up of three sub-pixels (a red light emitting sub-pixel that emits red light, a green light emitting sub-pixel that emits green light, and a blue light emitting sub-pixel that emits blue light). Additionally, the light emitting elements constituting each pixel are taken to be driven in line sequence, and a display frame rate is taken to be FR (times/second). That is to say, (N/3) pixels arranged in an mth column (where m=1, 2, 3, . . . , M), or more specifically, light emitting elements respectively made up of N sub-pixels, are driven simultaneously. To state this differently, in respective light emitting elements constituting one column, timing of their light emission/light nonemission is controlled by the unit of the column to which they belong. Note that processing for writing a video signal with regard to respective pixels making up one column may be processing to write a video signal for all pixels simultaneously (which hereinafter may in some cases be called simply simultaneous write processing), or may be processing to write a sequential video signal for each respective pixel (which hereinafter may in some cases be called simply sequential write processing). Which write processing is used may be suitable selected according to the structure of the drive circuit.

Here, in principle, drive and operation relating to a light emitting element posited at an mth column and nth row (where n=1, 2, 3, . . . , N) are described, but such a light emitting element refers, hereinafter, to an (n, m)th light emitting element or (n, m)th sub-pixels. Accordingly, various processing (threshold voltage cancel processing, write processing, and mobility correction processing, described later) is performed until a horizontal scanning period of respective pixels arranged in the mth column (mth horizontal scanning period) ends. Note that performing write processing and mobility correction processing within the mth horizontal scanning period is necessary. On the other hand, depending on the type of the drive circuit, threshold voltage cancel processing and preprocessing accompanying this can be performed in advance of the mth horizontal scanning period.

Accordingly, after the various processing described above has finished completely, light emission units constituting the respective light emitting elements arranged in the mth column are caused to emit light. Note that after the various processing described above has finished completely, the light emission units may be caused to emit light immediately, or the light emission units may be caused to emit light after a predetermined period (for example, a predetermined horizontal scanning period for several columns) has elapsed. This predetermined period can be set suitably according to a specification of the display device or structure or the like of the drive circuit. Note that in the explanation below, for convenience of explanation, the light emission unit is taken to be caused to emit light immediately after the various types of processing finish. Accordingly, light emission of the light emission units constituting the respective light emitting elements arranged in the mth column is continued until just before the start of a horizontal scanning period of respective light emitting elements arranged in an (m+m)th column. Here, "m'" is determined according to a setting specification of the display device. That is to say, light emission of light emission units constituting respective light emitting elements arranged in an mth column in a given display frame is continued until an (m+m'−1)th horizontal scanning period. On the other hand, light emission units constituting respective light emitting elements arranged in an mth column are in principle maintained in a light nonemission state from a start period of an (m+m')th horizontal scanning period until write processing and mobility correction processing within an mth horizontal scanning period in the subsequent display frame are completed. By establishing a period of the above-described light nonemission state (which hereinafter may in some cases be called simply a light nonemission period), afterimage blur accompanying active-matrix drive is reduced, and moving-image quality can be made more excellent. Note, however, that the light emission/light nonemission state of respective sub-pixels (light emitting elements) is not limited to the state described above. Additionally, the time length of the horizontal scanning period is a time length of less than (1/FR)×(1/M) seconds. In a case where the value of (m+m') exceeds M, the horizontal scanning period of the exceeding amount is processed in the next display frame.

In two source/drain regions having one transistor, the term "source/drain region of one side" may in some cases be used with the meaning of a source/drain region on a side connected to an electric power source unit. Additionally, a transistor being in an "on" state signifies a state in which a channel has been formed between source/drain regions. Whether or not current flows from the source/drain region of one side of the transistor to the source/drain region of the other side is immaterial. On the other hand, a transistor being in an "off" state signifies a state in which a channel has not been formed between source/drain regions. Additionally, a source/drain region of a given transistor being connected to a source/drain region of another transistor includes a mode in which the source/drain region of the given transistor and the source/drain region of the other transistor occupy the same region. Further, a source/drain region can be constituted not only by impurity-containing polysilicon or amorphous silicon or the like, but can be constituted by a metal, an alloy, electrically conductive particles, a layered structure of these, or layers made up of an organic material (an electrically conductive polymer). Additionally, in timing charts used in the explanation below, length of a horizontal axis indicating each period is schematic, and does not indicate a proportion of time length of each period.

A drive method of a light emission unit ELP employed in a drive circuit indicated in FIG. 4 or the like is made up of steps of, for example:

(a) performing preprocessing to apply a first node $ND_1$ initialization voltage to a first node $ND_1$ and to apply a second node $ND_2$ initialization voltage to a second node $ND_2$ so that an electric potential difference between the first node $ND_1$ and the second node $ND_2$ exceeds a threshold voltage of a drive transistor $TR_D$, and moreover an electric potential difference between the second node $ND_2$ and a cathode electrode disposed on a light emission unit ELP does not exceed a threshold voltage of the light emission unit ELP, and subsequently, (b) performing, in a state where the electric potential of the first node $ND_1$ is maintained, threshold voltage cancel processing to change the electric potential of the second node $ND_2$ toward an electric potential obtained by subtracting the threshold voltage of the drive transistor $TR_D$ from the electric potential of the first node $ND_1$, and thereafter, (c) performing write processing to apply a video signal from a data line DTL to the first node $ND_1$ via a write transistor $TR_W$ switched to an "on" state by a signal from a scanning line SCL, and subsequently, (d) driving the light emission unit ELP by putting the first node $ND_1$ in a floating state by switching the write transistor $TR_W$ to an "off" state by the signal from the scanning line SCL, and causing current to flow to the light emission unit ELP from an electric power source unit 2100 via the drive transistor $TR_D$ according to the value of the electric potential between the first node $ND_1$ and the second node $ND_2$.

As was described above, the step (b) performs, in a state where the electric potential of the first node $ND_1$ is maintained, threshold voltage cancel processing to change the electric potential of the second node $ND_2$ toward an electric potential obtained by subtracting the threshold voltage of the drive transistor $TR_D$ from the electric potential of the first node $ND_1$. More specifically, to change the electric potential of the second node $ND_2$ toward an electric potential obtained by subtracting the threshold voltage of the drive transistor $TR_D$ from the electric potential of the first node $ND_1$, voltage exceeding a voltage which is the threshold voltage of the drive transistor $TR_D$ added to the electric potential of the second node $ND_2$ in the step (a) is applied to the source/drain region of one side of the drive transistor $TR_D$. Qualitatively, in the threshold voltage cancel processing, the extent at which the electric potential between the first node $ND_1$ and the second node $ND_2$ (stated differently, the electric potential between the gate electrode and the source region of the drive transistor $TR_D$) approaches the threshold voltage of the drive transistor $TR_D$ is affected by the time of the threshold voltage cancel processing. Consequently, in a mode in which for example sufficiently long time of threshold voltage cancel processing is established, the electric potential of the second node $ND_2$ reaches an electric potential obtained by subtracting the threshold voltage of the drive transistor $TR_D$ from the electric potential of the first node $ND_1$. Accordingly, the electric potential difference between the first node $ND_1$ and the second node $ND_2$ reaches the threshold voltage of the drive transistor $TR_D$, and the drive transistor $TR_D$ changes to an "off" state. On the other hand, in a mode in which for example the time of threshold voltage cancel processing is established must unavoidably be set short, a case may occur in which the electric potential between the first node $ND_1$ and the second node $ND_2$ becomes larger than the threshold voltage of the drive transistor $TR_D$, and the drive transistor $TR_D$ does not change to an "off" state. The drive transistor $TR_D$ need not necessarily change to an "off" state as a result of threshold voltage cancel processing.

Next, drive circuit structure of each respective drive circuit and a drive method of a light emission unit ELP employed in these drive circuits will be explained in detail hereinafter.

5Tr/1C Drive Circuit

Figure 5:
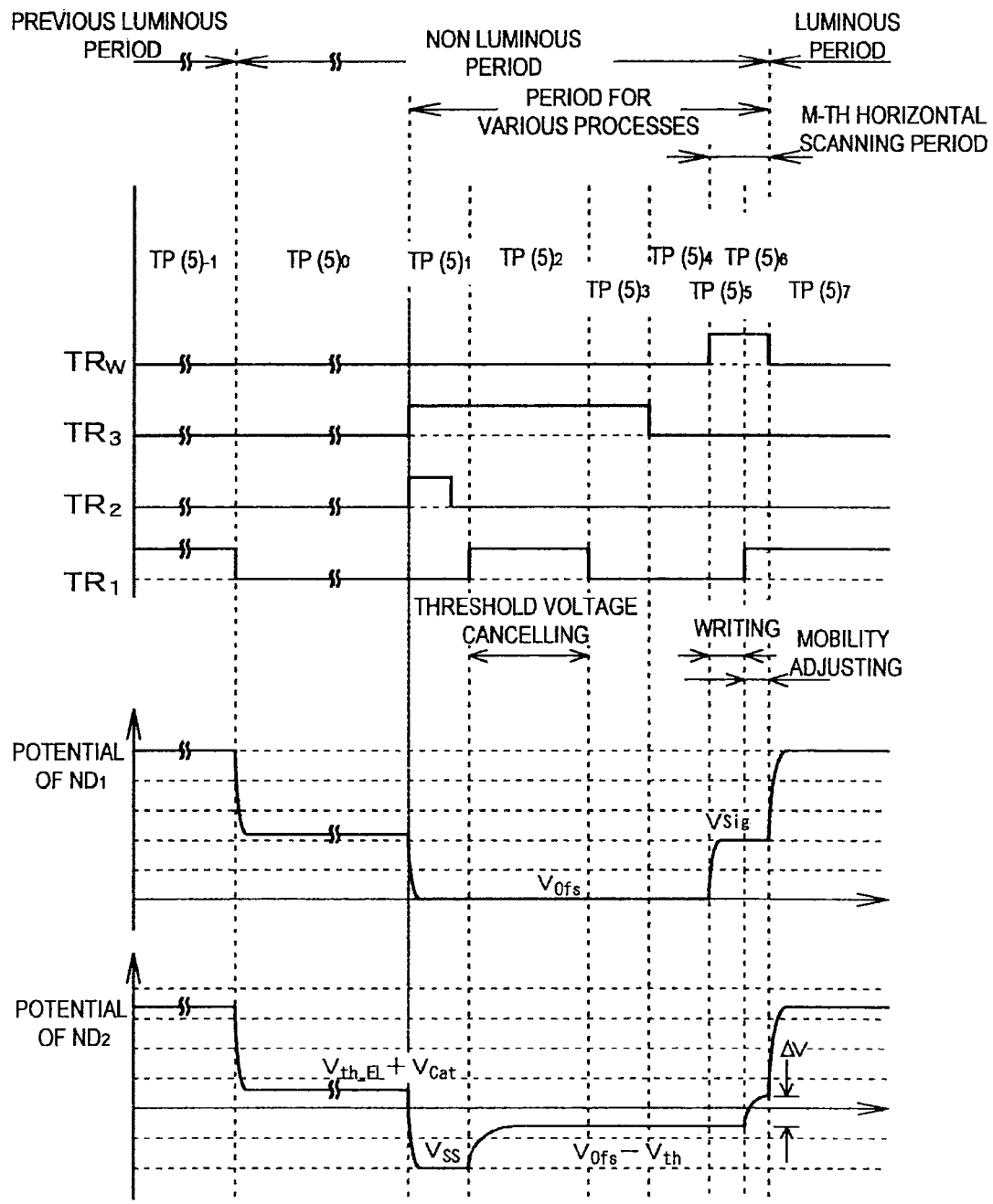
FIG. 5 is a timing chart of drive of the 5Tr/1C drive circuit.

An equivalent circuit diagram of a 5Tr/1C drive circuit is depicted in FIG. 4, a timing chart of drive of the 5Tr/1C drive circuit illustrated in FIG. 4 is depicted schematically in FIG. 5, and on/off states and the like of each transistor of the 5Tr/1C drive circuit are depicted schematically in FIG. 6A through FIG. 6I.

This 5Tr/1C drive circuit is constituted by five transistors: a write transistor $TR_W$, a drive transistor $TR_D$, a first transistor $TR_1$, a second transistor $TR_2$, and a third transistor $TR_3$. It is further constituted by a capacitor $C_1$. Note that the write transistor $TR_W$, the first transistor $TR_1$, the second transistor $TR_2$, and the third transistor $TR_3$ may be constituted by a p-channel type TFT. Note also that the drive transistor $TR_D$ that is shown in FIG. 4 is equivalent to the drive transistor 1022 that is shown in FIG. 3.

First Transistor $TR_1$

A source/drain region of one side of the first transistor $TR_1$ is connected to the electric power source unit 2100 (voltage $V_{CC}$), and a source/drain region of another side of the first transistor $TR_1$ is connected to a source/drain region of one side of the drive transistor $TR_D$. Additionally, on/off operation of the first transistor $TR_1$ is controlled by a first transistor control line $CL_1$ extending from a first transistor control circuit 2111 and connected to a gate electrode of the first transistor $TR_1$. The electric power source unit 2100 is provided to supply current to a light emission unit ELP and cause the light emission unit ELP to emit light.

Drive Transistor $TR_D$

The source/drain region of one side the drive transistor $TR_D$, as was described above, is connected to the source/drain region of the other side of the first transistor $TR_1$. On the other hand, the source/drain region of the other side of the drive transistor $TR_D$ is connected to:

(1) an anode electrode of the light emission unit ELP,
(2) a source/drain region of another side of the second transistor $TR_2$, and
(3) one electrode of the capacitor $C_1$, and makes up the second node $ND_2$. Additionally, the gate electrode of the drive transistor $TR_D$ is connected to:

(1) a source/drain region of another side of the write transistor $TR_W$,
(2) a source/drain region of another side of the third transistor $TR_3$, and
(3) another electrode of the capacitor $C_1$, and makes up the first node $ND_1$.

Here, the drive transistor $TR_D$, in a light emission state of a light emitting element, is driven according to equation (1) hereinafter so as to cause a drain current $I_{ds}$ to flow In the light emission state of the light emitting element, the source/drain region on one side of the drive transistor $TR_D$ functions as a drain region, and the source/drain region of the other side functions as a source region. For convenience of explanation, in the explanation hereinafter, in some cases the source/drain region of one side of the drive transistor $TR_D$ may be called simply the drain region, and the source/drain region of the other side may be called the source region. Note that:

μ: effective mobility
L: channel length
W: channel width
$V_{gs}$: electric potential between gate electrode and source region
$V_{th}$: threshold voltage $C_{ox}$: (relative permittivity of gate insulation layer)× (electric constant)/(thickness of gate insulation layer)

$k \equiv (½)·(W/L)·C_{ox}$ is taken to hold.

$$I_{ds} = k·μ·(V_{gs} - V_{th})^2 \quad (1)$$

The light emission unit ELP emits light due to this drain current $I_{ds}$ flowing through the light emission unit ELP. The light emission state (luminance) of the light emission unit ELP is controlled by the size of the value of this drain current $I_{ds}$.

Write Transistor $TR_W$

The source/drain region of the other side of the write transistor $TR_W$, as was described above, is connected to the gate electrode of the drive transistor $TR_D$. On the other hand, a source/drain region of one side of the write transistor $TR_W$ is connected to a data line DTL extending from a signal output circuit 2102. Accordingly, a video signal $V_{Sig}$ for controlling luminance at the light emission unit ELP is supplied to the source/drain region of one side via the data line DTL. Note that various signals or voltages (signals or various reference voltages or the like for precharge drive) other than $V_{Sig}$ may be supplied to the source/drain region of one side via the data line DTL. Additionally, on/off operation of the write transistor $TR_W$ is controlled by a scanning line SCL extending from a scanning circuit 2101 and connected to the gate electrode of the write transistor $TR_W$.

Second Transistor $TR_2$

The source/drain region of the other side of the second transistor $TR_2$, as was described above, is connected to the source region of the drive transistor $TR_D$. On the other hand, voltage $V_{SS}$ for initializing the electric potential of the second node $ND_2$ (that is to say, the electric potential of the source region of the drive transistor $TR_D$) is supplied to the source/drain region of one side of the second transistor $TR_2$. Additionally, on/off operation of the second transistor $TR_2$ is controlled by a second transistor control line $AZ_2$ extending from a second transistor control circuit 2112 and connected to the gate electrode of the second transistor $TR_2$.

Third Transistor $TR_3$

The source/drain region of the other side of the third transistor $TR_3$, as was described above, is connected to the gate electrode of the drive transistor $TR_D$. On the other hand, voltage $V_{Ofs}$ for initializing the electric potential of the first node $ND_1$ (that is to say, the electric potential of the gate electrode of the drive transistor $TR_D$) is supplied to the source/drain region of one side of the third transistor $TR_3$. Additionally, on/off operation of the third transistor $TR_3$ is controlled by a third transistor control line $AZ_3$ extending from a third transistor control circuit 2113 and connected to the gate electrode of the third transistor $TR_3$.

Light Emission Unit ELP

The anode electrode of the light emission unit ELP, as was described above, is connected to the source region of the drive transistor $TR_D$. On the other hand, voltage $V_{Cst}$ is applied to the cathode electrode of the light emission unit ELP. Capacitance of the light emission unit ELP is indicated by a symbol $C_{EL}$. Additionally, threshold voltage taken to be necessary for light emission of the light emission unit ELP is taken to be $V_{th-EL}$. That is to say, when voltage of $V_{th-EL}$ or more is applied between the anode electrode and the cathode electrode of the light emission unit ELP, the light emission unit ELP emits light.

In the explanation hereinafter, values of voltage or electric potential are as shown below, but these are only values for explanation, and there is no limitation to these values.

$V_{Sig}$: Video signal for controlling luminance at the light emission unit ELP
0 volts to 10 volts
$V_{CC}$: Voltage of the electric power source unit 2100
20 volts
$V_{Ofs}$: Voltage for initializing the electric potential of the gate electrode of the drive transistor $TR_D$ (the electric potential of the first node $ND_1$)
0 volts
$V_{SS}$: Voltage for initializing the electric potential of the source region of the drive transistor $TR_D$ (the electric potential of the second node $ND_2$)

−10 volts $V_{th}$: Threshold voltage of the drive transistor $TR_D$ 3 volts $V_{Cat}$: Voltage applied to the cathode electrode of the light emission unit ELP 0 volts $V_{th-EL}$: Threshold voltage of the light emission unit ELP 3 volts Operation of the 5Tr/1C drive circuit will be described hereinafter. Note that, as was described above, it is described that a light emission state is taken to begin immediately after the various types of processing (threshold voltage cancel processing, write processing, and mobility correction processing) have finished, but there exists no limitation to this. This is similar for the 4Tr/1C drive circuit, 3Tr/1C drive circuit, and 2Tr/1C drive circuit that will be described later.

Figure 6A:
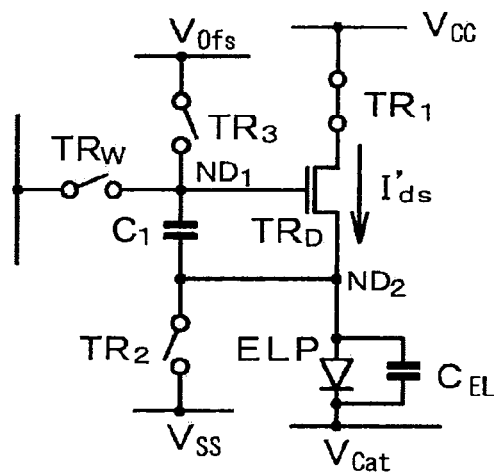
FIG. 6A is an explanatory figure that shows an on/off state and the like of each transistor in the 5Tr/1C drive circuit.

Period—$TP(5)_{-1}$ (Refer to FIG. 5 and FIG. 6A)

This [period—$TP(5)_{-1}$] is for example operation in a previous display Line, and is a period in which the (n, m)th light emitting elements after completion of the previous various types of processing are in the light emission state. That is to say, drain current $I'_{ds}$ flows to in the light emission unit ELP in the light emitting elements mating up the (n, m)th sub-pixels on a basis of equation (5) described later, and luminance of the light emission unit ELP in the light emitting elements making up the (n, m)th sub-pixels is a value corresponding to the drain current $I'_{ds}$. Here, the write transistor $TR_W$, the second transistor $TR_2$, and the third transistor $TR_3$ are in an "off" state, and first transistor $TR_1$ and drive transistor $TR_D$ are in an "on" state. The light emission state of the (n, m)th light emitting elements is continued until immediately before the start of the horizontal scanning period of the light emitting elements arranged in the (m+m')th column.

[Period—$TP(5)_0$] through [period—$TP(5)_4$] depicted in FIG. 5 are an operation period from after the light emission state after completion of the previous various types of processing until immediately before the next write processing is performed. That is to say, this [period—$TP(5)_0$] through [period—$TP(5)_4$] is a period of given time length for example from the start period of the (m+m')th horizontal scanning period in the previous display frame until the end period of the (m−1)th horizontal scanning period. Note that [period—$TP(5)_1$] through [period—$TP(5)_4$] can be taken to be constituted to be included in the mth horizontal scanning period in the present display frame.

Accordingly, in this [period—$TP(5)_0$] through [period—$TP(5)_4$], the (n, m)th light emitting elements are in principle in a light nonemission state. That is to say, in [period—$TP(5)_0$] through [period—$TP(5)_1$] and [period—$TP(5)_3$] through [period—$TP(5)_4$], the first transistor $TR_1$ is in an "off" state, and thus the light emitting elements do not emit light. Note that in [period—$TP(5)_2$], the first transistor $TR_1$ is in an "on" state. However; in this period, threshold voltage cancel processing described later is performed. As will be described in detail in the explanation of threshold voltage cancel processing, if it is assumed that equation (2) described later is satisfied, the light emitting elements do not emit light.

The respective periods of [period—$TP(5)_0$] through [period—$TP(5)_4$] are firstly described hereinafter. Note that the lengths of the start period of [period—$TP(5)_1$] and the respective periods of [period—$TP(5)_1$] through [period—$TP(5)_4$] may be set suitably in accordance with the design of the display device.

Period—$TP(5)_0$

As was described above, in [period—$TP(5)_0$], the (n, m)th light emitting elements are in a light emission state. The write transistor $TR_W$, the second transistor $TR_2$, and the third transistor $TR_3$ are in an "off" state. Additionally, at the time of transition from [period —$TP(5)_{-1}$] to [period—$TP(5)_0$], because the first transistor $TR_1$ changes to an "off" state, the electric potential of the second node $ND_2$ (the source region of the drive transistor $TR_D$ or the anode electrode of the light emission unit ELP) falls to ($V_{th-EL}+V_{Cat}$), and light emission unit ELP changes to a light nonemission state. Additionally, the electric potential of the first node $ND_1$ (the gate electrode of the drive transistor $TR_D$) in a floating state also falls, so as to follow the fall in the electric potential of the second node $ND_2$.

Figure 6B:
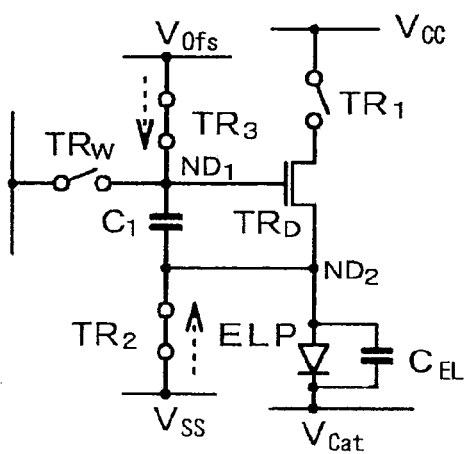
FIG. 6B is an explanatory figure that shows the on/off state and the like of each of the transistors in the 5Tr/1C drive circuit.
Figure 6C:
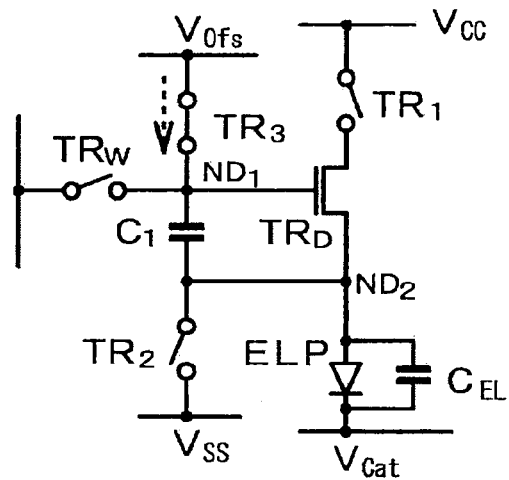
FIG. 6C is an explanatory figure that shows the on/off state and the like of each of the transistors in the 5Tr/1C drive circuit.

Period—$TP(5)_1$ (Refer to FIG. 6B and FIG. 6C)

In this [period—$TP(5)_1$], preprocessing for performing threshold voltage cancel processing described later is performed That is to say, at the start of [period—$TP(5)_1$], the second transistor $TR_2$ and the third transistor $TR_3$ are put in an "on" state by putting the second transistor control line $AZ_2$ and the third transistor control line $AZ_3$ at high level. As a result of this, the electric potential of the first node $ND_1$ changes to $V_{Ofs}$ (for example, 0 volts). On the other hand, the electric potential of the second node $ND_2$ changes to $V_{SS}$ (for example, −10 volts). Accordingly, prior to completion of this [period—$TP(5)_1$], the second transistor $TR_2$ is put in an "off" state by putting the second transistor control line $AZ_2$ at low level. Note that the second transistor $TR_2$ and the third transistor $TR_3$ may be put in an "on" state simultaneously, the second transistor $TR_2$ may be put in an "on" state firstly, or the third transistor $TR_3$ may be put in an "on" state firstly.

Due to the foregoing processing, the electric potential difference between the gate electrode and the source region of the drive transistor $TR_D$ becomes $V_{th}$ or higher. The drive transistor $TR_D$ changes to an "on" state.

Figure 6D:
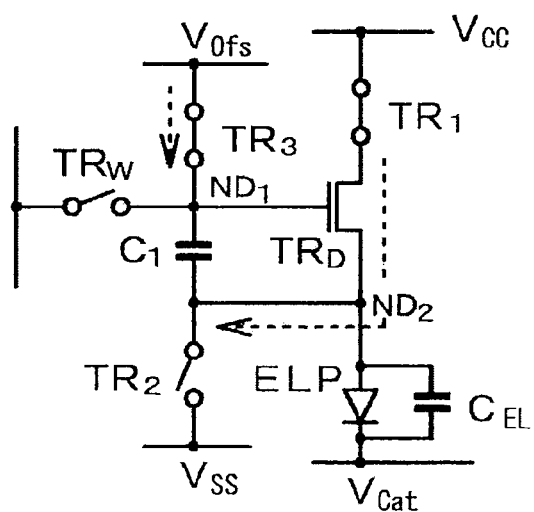
FIG. 6D is an explanatory figure that shows the on/off state and the like of each of the transistors in the 5Tr/1C drive circuit.

Period—$TP(5)_2$ (Refer to FIG. 6D)

Next, threshold voltage cancel processing is performed. That is to say, the first transistor $TR_1$ is put in an "on" state by putting the first transistor control line $CL_1$ at high level while maintaining the third transistor $TR_3$ in an "on" state. As a result of this, the electric potential of the first node $ND_1$ does not change (maintaining $V_{Ofs}$=0 volts), and the electric potential of the second node $ND_2$ changes toward an electric potential obtained by subtracting the threshold voltage $V_{th}$ of the drive transistor $TR_D$ from the electric potential of the first node $ND_1$. That is to say, the electric potential of the second node $ND_2$ in a floating state rises. Accordingly, when the electric potential between the gate electrode and the source region of the drive transistor $TR_D$ reaches $V_{th}$, the drive transistor $TR_D$ changes to an "off" state. Specifically, the electric potential of the second node $ND_2$ in a floating state approaches ($V_{Ofs}-V_{th}$=−3 volts>$V_{SS}$), and ultimately becomes ($V_{Ofs}-V_{th}$). Here, if equation (2) hereinafter is assured, or to state this differently, if the electric potential is selected and determined so as to satisfy equation (2), the light emission unit ELP does not emit light.

$$(V_{Ofs}-V_{th})<(V_{th-EL}+V_{Cat}) \quad (2)$$

In this [period—$TP(5)_2$], the electric potential of the second node $ND_2$ ultimately becomes ($V_{Ofs}-V_{th}$). That is to say, the electric potential of the second node $ND_2$ is determined dependent solely on the threshold voltage $V_{th}$ of the drive transistor $TR_D$ and the voltage $V_{Ofs}$ for initializing the gate electrode of the drive transistor $TR_D$. Stated differently, there is no dependence on the threshold voltage $V_{th-EL}$ of the light emission unit ELP.

Figure 6E:
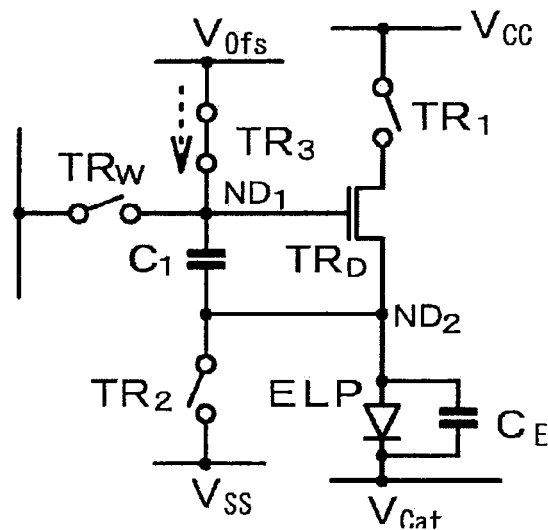
FIG. 6E is an explanatory figure that shows the on/off state and the like of each of the transistors in the 5Tr/1C drive circuit.

Period—$TP(5)_3$ (Refer to FIG. 6E)

Thereafter, the first transistor $TR_1$ is put in an "off" state by putting the first transistor control line $CL_1$ at low level while maintaining the third transistor $TR_3$ in an "on" state. As a result of this, the electric potential of the first node $ND_1$ is held unchanged (maintaining $V_{Ofs}=0$ volts) and the electric potential of the second node $ND_2$ also is held unchanged ($V_{Ofs}-V_{th}=-3$ volts).

Figure 6F:
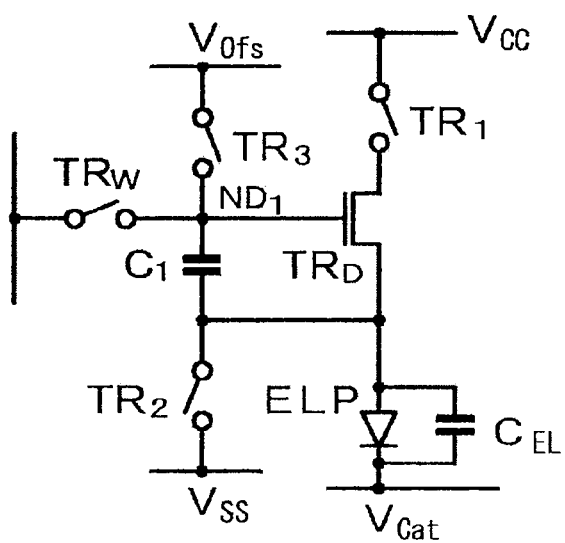
FIG. 6F is an explanatory figure that shows the on/off state and the like of each of the transistors in the 5Tr/1C drive circuit.

Period—$TP(5)_4$ (Refer to FIG. 6F)

Next, the third transistor $TR_3$ is put in an "off" state by putting the third transistor control line $AZ_3$ at low level. As a result of this, the electric potentials of the first node $ND_1$ and the second node $ND_2$ substantially do not change. In actuality, changes can occur due to electrostatic coupling of parasitic capacitance or the like, but, normally, these can be ignored.

Next, the respective periods of [period—$TP(5)_5$] through [period—$TP(5)_7$] are described. Note that, as is described later, write processing is performed in [period—$TP(5)_5$], and mobility correction processing is performed in [period—$TP(5)_6$]. As was described above, performing these sets of processing within the mth horizontal scanning period is necessary. For convenience of explanation, a start period of [period—$TP(5)_5$] and an end period of [period—$TP(5)_6$] are explained as coinciding respectively with the start period and the end period of the mth horizontal scanning period.

Figure 6G:
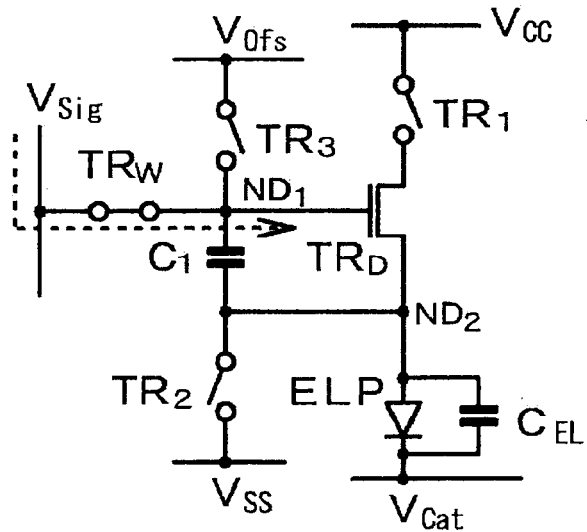
FIG. 6G is an explanatory figure that shows the on/off state and the like of each of the transistors in the 5Tr/1C drive circuit.

Period—$TP(5)_5$ (Refer to FIG. 6G)

Thereafter, write processing is executed with respect to the drive transistor $TR_D$. Specifically, the write transistor $TR_W$ is put in an "on" state by putting the electric potential of the data line DTL to the video signal $V_{Sig}$ for controlling the luminance at the light emission unit ELP, and then putting the scanning line SCL at high level, while maintaining an "off" state of the first transistor $TR_1$, the second transistor $TR_2$, and the third transistor $TR_3$. As a result of this, the electric potential of the first node $ND_1$ rises to $V_{Sig}$.

Here, capacitance of the capacitor $C_1$ is indicated by a value $c_1$, and capacitance of the capacitance $C_{EL}$ of the light emission unit ELP is indicated by a value $c_{EL}$. Accordingly, the value of parasitic capacitance between the gate electrode and the source region of the drive transistor $TR_D$ is taken to be $c_{gs}$. When the electric potential of the gate electrode of the drive transistor $TR_D$ has changed from $V_{Ofs}$ to $V_{Sig}$ ($>V_{Ofs}$), the electric potentials of the two ends of the capacitor $C_1$ (the electric potentials of the first node $ND_1$ and the second node $ND_2$), in principle, change. That is to say, an electric charge based on the amount of change ($V_{Sig}-V_{Ofs}$) in the electric potential of the gate electrode of the drive transistor $TR_D$ (=the electric potential of the first node $ND_1$) is allocated to capacitor $C_1$, the capacitance $C_{EL}$ of the light emission unit ELP, and the parasitic capacitance between the gate electrode and the source region of the drive transistor $TR_D$. However, if the value $c_{EL}$ is sufficiently large in comparison with the value $c_1$ and the value $c_{gs}$, change is small for the electric potential of the source region (second node $ND_2$) of the drive transistor $TR_D$ based on the amount of change ($V_{Sig}-V_{Ofs}$) in the electric potential of the gate electrode of the drive transistor $TR_D$. Accordingly, generally, the capacitance value $c_{EL}$ of the capacitance $C_{EL}$ of the light emission unit ELP is larger than the capacitance value $c_1$ of the capacitor $C_1$ and the value $c_{gs}$ of the parasitic capacitance of the drive transistor $TR_D$. In this regard, for convenience of explanation, except in cases where there is special need, explanation is given without consideration for change in the electric potential of the second node $ND_2$ occurring due to change in the electric potential of the first node $ND_1$. This is similar for other drive circuits as well. Note that in the timing chart of drive depicted in FIG. 5 as well, depiction is made without consideration for change in the electric potential of the second node $ND_2$ occurring due to change in the electric potential of the first node $ND_1$. When the electric potential of the gate electrode (first node $ND_1$) of the drive transistor $TR_D$ is taken to be $V_g$ and the electric potential of the source region (second node $ND_2$) of the drive transistor $TR_D$ is taken to be $V_s$, the value of $V_g$ and the value of $V_s$ change as indicated below. Thus, the electric potential difference of the first node $ND_1$ and the second node $ND_2$, or in other words, the electric potential difference $V_{gs}$ between the gate electrode and the source region of the drive transistor $TR_D$, can be expresses by equation (3) below.

$V_g = V_{Sig}$ $V_s \approx V_{Ofs} - V_{th}$ $$V_{gs} \approx V_{Sig} - (V_{Ofs} - V_{th}) \quad (3)$$

That is to say, $V_{gs}$, obtained by write processing with respect to the drive transistor $TR_D$, is dependent solely on the video signal $V_{Sig}$ for controlling luminance at the light emission unit ELP, the threshold voltage $V_{th}$ of the drive transistor $TR_D$, and the voltage $V_{Ofs}$ for initializing the electric potential of the source region of the drive transistor $TR_D$. Accordingly, it is unrelated to the threshold voltage $V_{th-EL}$ of the light emission unit ELP.

Figure 6H:
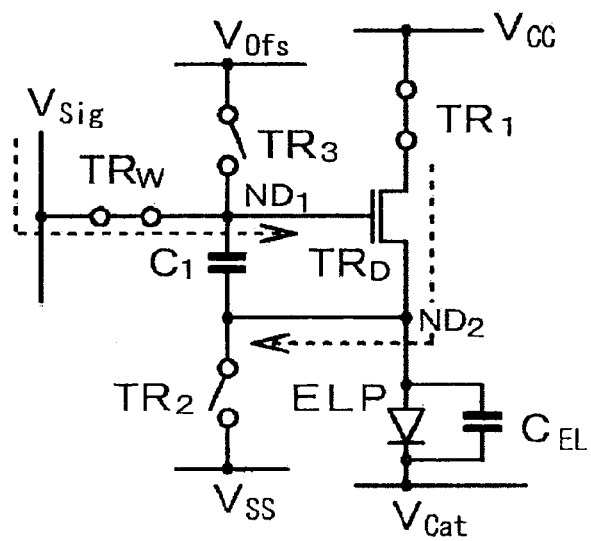
FIG. 6H is an explanatory figure that shows the on/off state and the like of each of the transistors in the 5Tr/1C drive circuit.

Period—$TP(5)_6$ (Refer to FIG. 6H)

Thereafter, correction (mobility correction processing) of the electric potential of the source region (second node $ND_2$) of the drive transistor $TR_D$ is performed on a basis of the size of the mobility μ of the drive transistor $TR_D$.

Generally, when the drive transistor $TR_D$ has been fabricated from a polysilicon film transistor or the like, occurrence of variation in the mobility μ between transistors is difficult to avoid. Consequently, even when a video signal $V_{Sig}$ having an identical value are applied to the gate electrodes of a plurality of drive transistors $TR_D$ in which differences in the mobility μ exist, differences occur between the drain current $I_{ds}$ flowing through drive transistors $TR_D$ having a large mobility μ and the drain current $I_{ds}$ flowing through drive transistors $TR_D$ having a small mobility μ. Accordingly, when this kind of difference occurs, uniformity of the screen of the display device is lost.

Consequently, specifically, the first transistor $TR_1$ is put into an "on" state by putting the first transistor control line $CL_1$ at high level while maintaining an "on" state of the drive transistor $TR_W$, and subsequently, after a predetermined time ($t_0$) has elapsed, the write transistor $TR_W$ is put in an "off" state and the first node $ND_1$ (the gate electrode of the drive transistor $TR_D$) is put in a floating state by putting the scanning line SCL at low level. Accordingly, in a case where the value of the mobility μ of the drive transistor $TR_D$ becomes large as a result of the foregoing, a rise quantity $\Delta V$ (electric potential correction value) of the electric potential at the source region of the drive transistor $TR_D$ becomes large, and in a case where the value of the mobility μ of the drive transistor $TR_D$ becomes small as a result of the foregoing, the rise quantity $\Delta V$ (electric potential correction value) of the electric potential at the source region of the drive transistor $TR_D$ becomes small. Here, the electric potential difference $V_{gs}$ between the gate electrode and the source region of the drive transistor $TR_D$ is transformed from equation (3) to equation (4) below.

$$V_{gs} \approx V_{Sig} - (V_{Ofs} - V_{th}) - \Delta V \quad (4)$$

Note that the predetermined time (total time $t_0$ of [period—$TP(5)_6$]) for executing mobility correction processing may, during design of the display device, be priorly determined as a design value. Additionally, the total time $t_0$ of [period—$TP(5)_6$] is determined so that the electric potential ($V_{Ofs}-V_{th}+\Delta V$) at the source region of the drive transistor $TR_D$ at this time satisfies equation (2') below. Accordingly, due to this, the light emission unit ELP does not emit light in [period—TP$(5)_6$]. Further, correction of variation in a coefficient k ($\equiv(1/2) \cdot (W/L) \cdot C_{ox}$) also is performed simultaneously by this mobility correction processing.

$$(V_{Ofs} - V_{th} + \Delta V) < V_{th\text{-}EL} + V_{Cat} \quad (2')$$

Figure 6I:
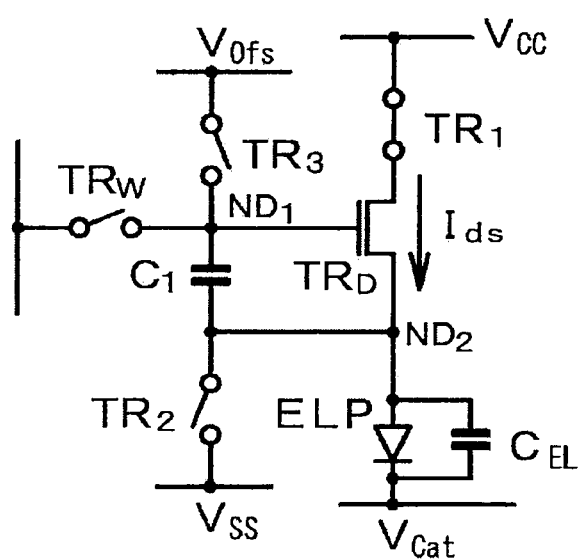
FIG. 6I is an explanatory figure that shows the on/off state and the like of each of the transistors in the 5Tr/1C drive circuit.

Period—TP$(5)_7$ (Refer to FIG. 6I)

Threshold-voltage cancel processing, write processing, and mobility correction processing are completed by the foregoing operations. As an incidental comment, as a result of the scanning line SCL changing to low level, the write transistor $TR_W$ changes to an "off" state and the first node $ND_1$ that is to say, the gate electrode of the drive transistor $TR_D$, changes to a floating state. On the other hand, the first transistor $TR_1$ maintains an "on" state, and the drain region of the drive transistor $TR_D$ is in a state of connection to the electric power source unit 2100 (voltage $V_{CC}$, for example 20 volts). Consequently, as a result of the foregoing, the electric potential of the second node $ND_2$ rises.

Here, as was described above, the gate electrode of the drive transistor $TR_D$ is in a floating state, and moreover, because the capacitor $C_1$ exists, a phenomenon similar to that in what is known as a bootstrap circuit occurs at the gate electrode of the drive transistor $TR_D$, and the electric potential of the first node $ND_1$ also rises. As a result, the electric potential difference $V_{gs}$ between the gate electrode and the source region of the drive transistor $TR_D$ maintains the value of equation (4).

Additionally, the electric potential of the second node $ND_2$ rises and exceeds ($V_{th\text{-}EL} + V_{Cat}$), and thus the light emission unit ELP starts to emit light. At this time, the current flowing through the light emission unit ELP is the drain current $I_{ds}$ flowing from the drain region of the drive transistor $TR_D$ to the source region of the drive transistor $TR_D$, and thus can be expressed by equation (1). Here, based on equation (1) and equation (4), equation (1) can be transformed into equation (5) below.

$$I_{ds} = k \cdot \mu \cdot (V_{Sig} - V_{Ofs} - \Delta V)^2 \quad (5)$$

Consequently, the drain current $I_{ds}$ flowing through the light emission unit ELP, for example in a case where $V_{Ofs}$ has been set at 0 volts, is proportional to the square of the value obtained by subtracting the value of the electric potential correction value $\Delta V$ at the second node $ND_2$ (the source region of the drive transistor $TR_D$) arising from the mobility $\mu$ of the drive transistor $TR_D$ from the value of the video signal $V_{Sig}$ for controlling the luminance at the light emission unit ELP. Stated differently, the drain current $I_{ds}$ flowing through the light emission unit ELP is not dependent on the threshold voltage $V_{th\text{-}EL}$ of the light emission unit ELP or the threshold voltage $V_{th}$ of the drive transistor $TR_D$. That is to say, the amount of light emission (luminance) of the light emission unit ELP is not subject to an effect by the threshold voltage $V_{th\text{-}EL}$ of the light emission unit ELP or an effect by the threshold voltage $V_{th}$ of the drive transistor $TR_D$. Accordingly, the luminance of the (n, m)th light emitting elements is a value that corresponds to the drain current $I_{ds}$.

Moreover, the larger is the mobility $\mu$ of the drive transistor $TR_D$, the larger becomes the electric potential correction value $\Delta V$, and thus the smaller becomes the value of $V_{gs}$ on the left side equation (4). Consequently, in equation (5), as a result of the value of $(V_{Sig} - V_{Ofs} - \Delta V)^2$ becoming small even when the value of the mobility $\mu$ is large, the drain current $I_{ds}$ can be corrected. That is to say, even in drive transistors $TR_D$ of differing mobility $\mu$, if the value of the video signal $V_{Sig}$ is the same, the drain current $I_{ds}$ comes to be substantially the same, and as a result, the drain current $I_{ds}$ flowing through the light emission unit ELP and controlling the luminance of the light emission unit ELP is made uniform. That is to say, variations in luminance arising from variations in the mobility $\mu$ (and moreover, variation in k) can be corrected.

The light emission state of the light emission unit ELP continues until the (m+m'−1)th horizontal scanning period. This time point corresponds to the end of [period—TP$(5)_{-1}$].

Light emission operation of light emitting elements 10 constituting (n, m)th sub-pixels is completed by the foregoing.

Next, an explanation of a 2Tr/1C drive circuit will be made.

2Tr/1C Drive Circuit

Figure 7:
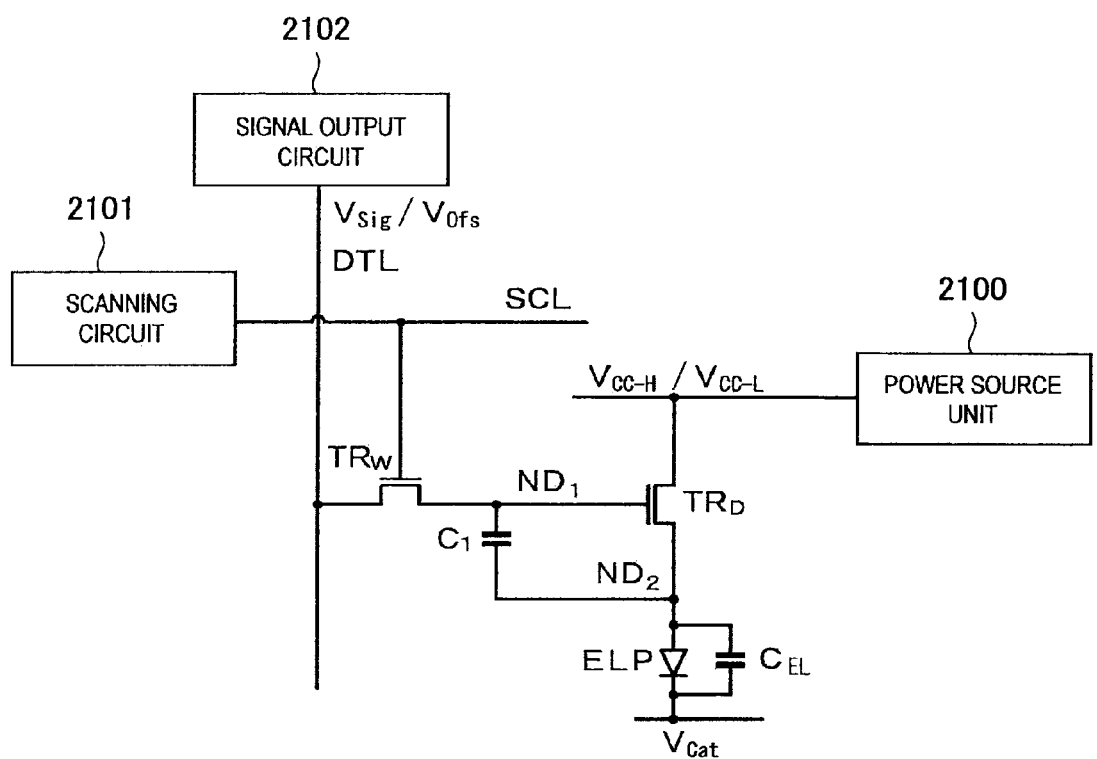
FIG. 7 is an equivalent circuit diagram of a 2Tr/1C drive circuit.
Figure 8:
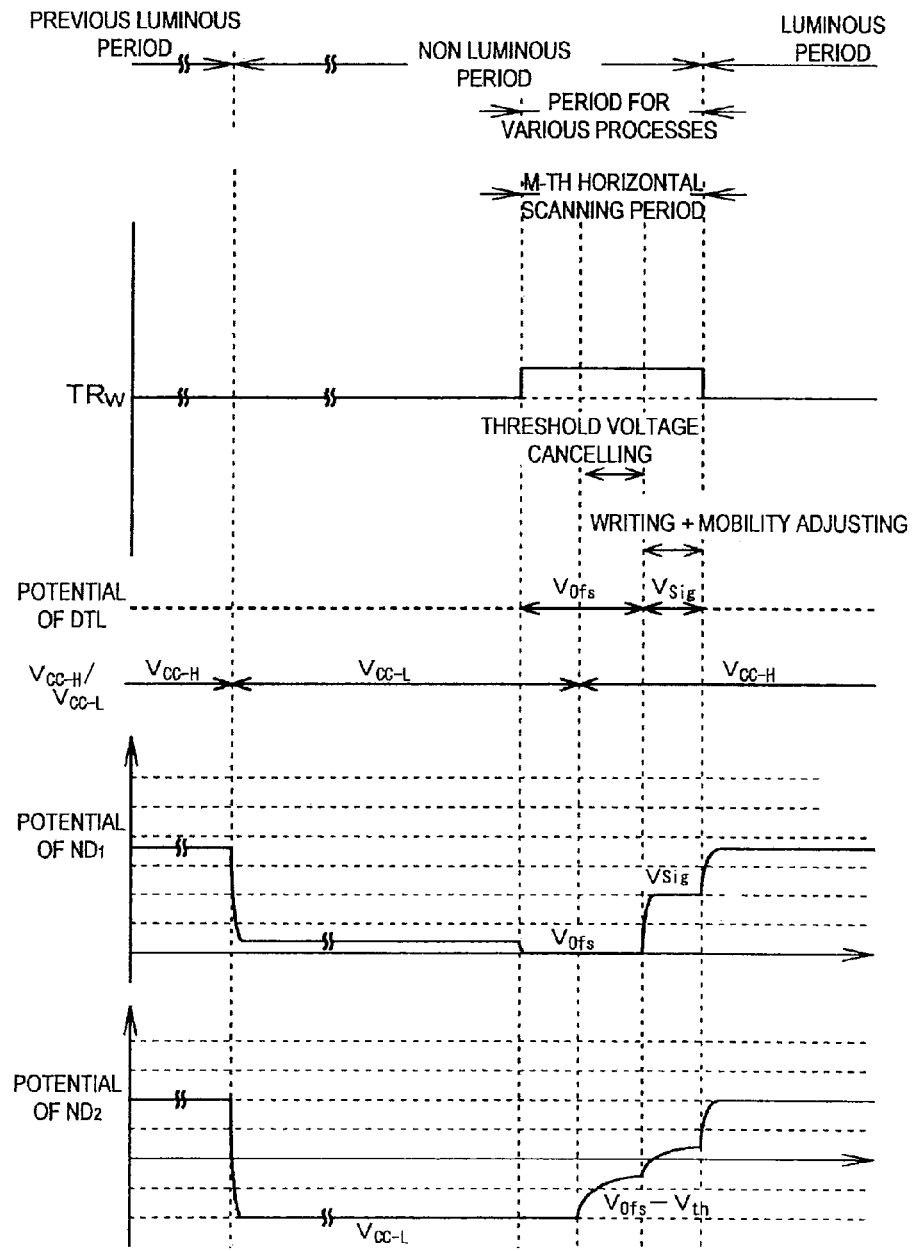
FIG. 8 is a timing chart of drive of the 2Tr/1C drive circuit.

An equivalent circuit diagram of a 2Tr/1C drive circuit is depicted in FIG. 7, a timing chart of drive is depicted schematically in FIG. 8, and on/off states and the like of each transistor of the 2Tr/1C drive circuit are depicted schematically in FIG. 9A through FIG. 9F.

Three transistors in the above-described 5Tr/1C drive circuit, being the first transistor $TR_1$, the second transistor $TR_2$, and the third transistor $TR_3$, are omitted from this 2Tr/1C drive circuit. That is to say, this 2Tr/1C drive circuit is constituted by two transistors, being a write transistor $TR_W$ and a drive transistor $TR_D$, and further is constituted by one capacitor $C_1$. Note also that the drive transistor $TR_D$ that is shown in FIG. 7 is equivalent to the drive transistor 1022 that is shown in FIG. 3.

Drive Transistor $TR_D$

The structure of the drive transistor $TR_D$ is the same as the structure of the drive transistor $TR_D$ described for the 5Tr/1C drive circuit, and thus detailed explanation is omitted. Note, however, that the drain region of the drive transistor $TR_D$ is connected to an electric power source unit 2100. Note also that voltage $V_{CC\text{-}H}$ for causing the light emission unit ELP to emit light and voltage $V_{CC\text{-}L}$ for controlled the electric potential of the source region of the drive transistor $TR_D$ are supplied from the electric power source unit 2100. Here, as values of voltages $V_{CC\text{-}H}$ and $V_{CC\text{-}L}$, $V_{CC\text{-}H}$=20 volts $V_{CC\text{-}L}$=−10 volts are used by way of example, but there is no limitation to these values.

Write Transistor $TR_W$

The structure of the write transistor $TR_W$ is the same as the structure of the write transistor $TR_W$ described for the 5Tr/1C drive circuit, and thus detailed explanation is omitted.

Light Emission Unit ELP

The structure of the light emission unit ELP is the same as the structure of the light emission unit ELP described for the 5Tr/1C drive circuit, and thus detailed explanation is omitted.

Operation of the 2Tr/1C drive circuit will be described hereinafter.

Figure 9A:
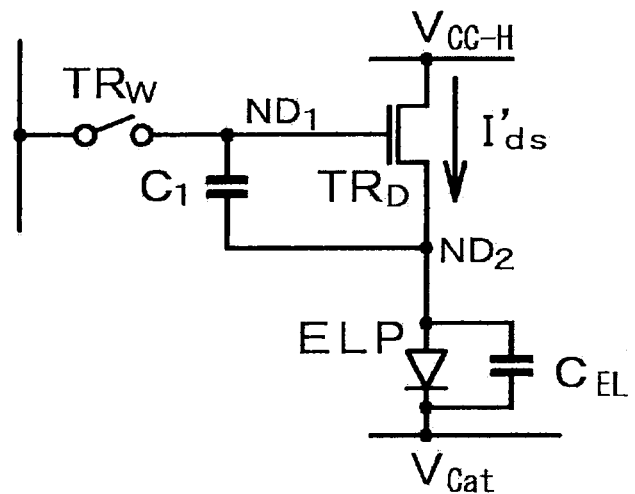
FIG. 9A is an explanatory figure that shows an on/off state and the like of each transistor in the 2Tr/1C drive circuit.

Period—TP$(2)_{-1}$ (Refer to FIG. 8 and FIG. 9A)

This [period—TP$(2)_{-1}$] is for example operation in a previous display frame, and is substantially the same operation of [period—TP$(5)_{-1}$] described for the 5Tr/1C drive circuit

[Period—TP$(2)_0$] through [period—TP$(2)_2$] depicted in FIG. 5 are periods corresponding to [period—TP$(5)_0$] through [period—TP$(5)_4$] depicted in FIG. 5, and are an operation period until immediately before the next write processing is performed. Accordingly, similarly to the 5Tr/1C drive circuit, in [period—TP$(2)_0$] through [period—TP$(2)_2$], the (n, m)th light emitting elements are in principle in a light nonemission state. Note, however, that in the operation of the 2Tr/1C drive circuit, as depicted in FIG. 8, aside from [period—TP$(2)_3$], the matter of [period—TP$(2)_1$] through [period—TP$(2)_2$] also including an mth horizontal scanning period differs from the operation of the 5Tr/1C drive circuit.

Not also that for convenience of explanation, a start period of [period—TP(2)$_1$] and an end period of [period—TP(2)$_3$] are explained as coinciding respectively with the start period and the end period of the mth horizontal scanning period.

The respective periods of [period—TP(2)$_0$] through [period—TP(2)$_2$] are described hereinafter. Note that similarly to what was explained for the 5Tr/1C drive circuit, the lengths of the respective periods of [period—TP(2)$_1$] through [period—TP(2)$_3$] may be set suitably in accordance with the design of the display device.

Figure 9B:
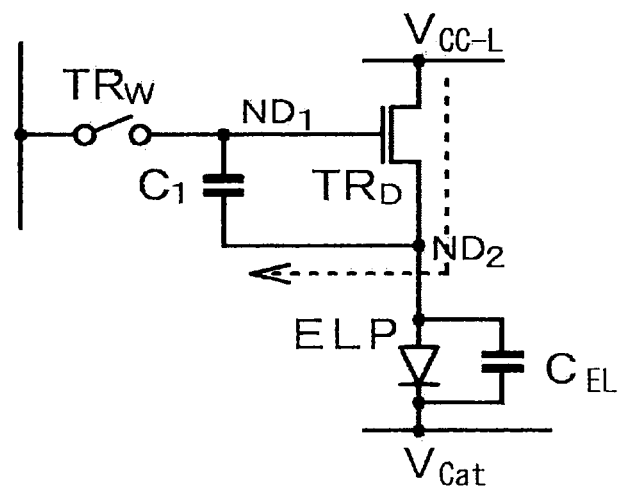
FIG. 9B is an explanatory figure that shows the on/off state and the like of each of the transistors in the 2Tr/1C drive circuit.

Period—TP(2)$_0$ (Refer to FIG. 9B)

This [period—TP(2)$_0$] is for example operation from the previous display frame to the present display frame. That is to say, this [period—TP(2)$_0$] is the period from the (m+m')th horizontal scanning period in the previous display frame to the (m−1)th horizontal scanning period in the present display frame. Accordingly, in this [period—TP(2)$_0$], the (n, m)th light emitting elements are in a light nonemission state. Here, at the time point of change from [period—TP(2)$_{-1}$] to [period—TP(2)$_0$], the voltage supplied from the electric power source unit 2100 is switched from $V_{CC-H}$ to $V_{CC-L}$. As a result, the electric potential of the second node ND$_2$ falls to $V_{CC-L}$, and the light emission unit ELP changes to a light nonemission state. Accordingly, the electric potential of the first node ND$_1$ (the gate electrode of the drive transistor TR$_D$) in a floating state also falls, so as to follow the fall in the electric potential of the second node ND$_2$.

Figure 9C:
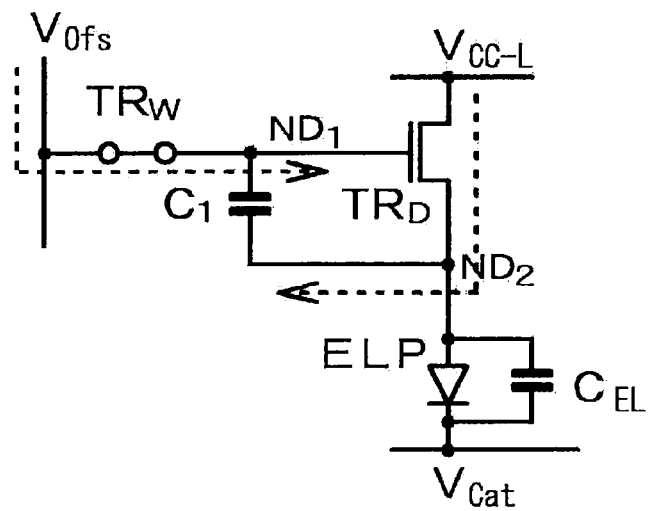
FIG. 9C is an explanatory figure that shows the on/off state and the like of each of the transistors in the 2Tr/1C drive circuit.

Period—TP(2)$_1$ (Refer to FIG. 9C)

Accordingly, the mth horizontal scanning period starts in the present display frame. In this [period—TP(2)$_1$], preprocessing for performing threshold voltage cancel processing is performed. At the time of the start of [period—TP(2)$_1$], the write transistor TR$_W$ is put in an "on" state by putting the scanning line SCL at high level. As a result, the electric potential of the first node ND$_1$ changes to $V_{Ofs}$ (for example, 0 volts). The electric potential of the second node ND$_2$ maintains $V_{CC-L}$ (for example, −10 volts).

Due to the above-described operation, the electric potential difference between the gate electrode and the source region of the drive transistor TR$_D$ becomes $V_{th}$ or higher, and the drive transistor TR$_D$ changes to an "on" state.

Figure 9D:
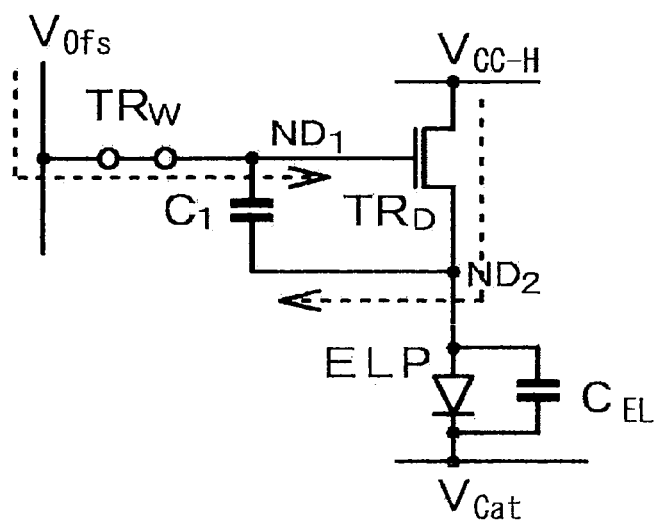
FIG. 9D is an explanatory figure that shows the on/off state and the like of each of the transistors in the 2Tr/1C drive circuit.

Period—TP(2)$_2$ (Refer to FIG. 9D)

Next, threshold voltage cancel processing is performed. That is to say, the voltage supplied from the electric power source unit 2100 is switched from $V_{CC-L}$ to $V_{CC-H}$ while the "on" state of the write transistor TR$_W$ is maintained. As a result of this, the electric potential of the first node ND$_1$ does not change (maintaining $V_{Ofs}$=0 volts), and the electric potential of the second node ND$_2$ changes toward an electric potential obtained by subtracting the threshold voltage $V_{th}$ of the drive transistor TR$_D$ from the electric potential of the first node ND$_1$. That is to say, the electric potential of the second node ND$_2$ in a floating state rises. Accordingly, when the electric potential between the gate electrode and the source region of the drive transistor TR$_D$ reaches $V_{th}$, the drive transistor TR$_D$ changes to an "off" state. Specifically, the electric potential of the second node ND$_2$ in a floating state approaches ($V_{Ofs}$−$V_{th}$=−3 volts), and ultimately becomes ($V_{Ofs}$−$V_{th}$). Here, if equation (2) hereinafter is assured, or to state this differently, if the electric potential is selected and determined so as to satisfy equation (2), the light emission unit ELP does not emit light.

In this [period—TP(2)$_2$], the electric potential of the second node ND$_2$ ultimately becomes ($V_{Ofs}$−$V_{th}$). That is to say, the electric potential of the second node ND$_2$ is determined dependent solely on the threshold voltage $V_{th}$ of the drive transistor TR$_D$ and the voltage $V_{Ofs}$ for initializing the gate electrode of the drive transistor TR$_D$. Accordingly, there is no relationship with the threshold voltage $V_{th-EL}$ of the light emission unit ELP.

Figure 9E:
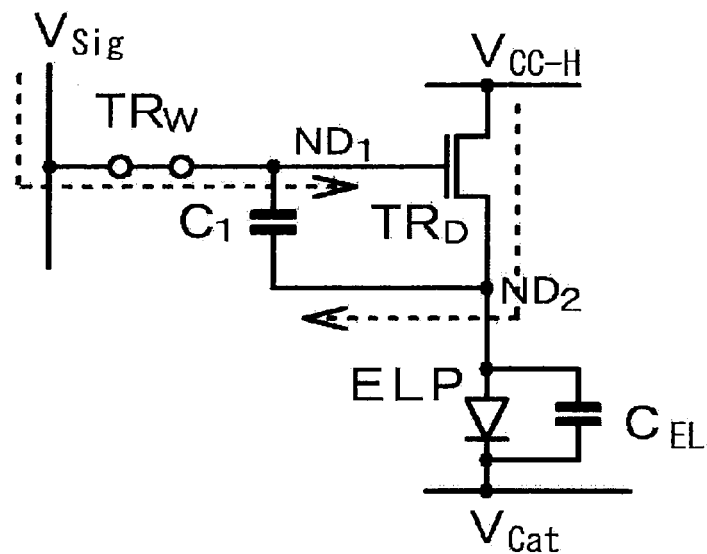
FIG. 9E is an explanatory figure that shows the on/off state and the like of each of the transistors in the 2Tr/1C drive circuit.
Figure 9F:
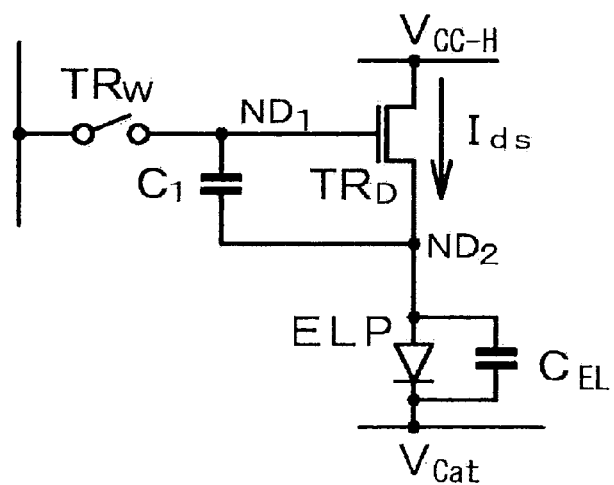
FIG. 9F is an explanatory figure that shows the on/off state and the like of each of the transistors in the 2Tr/1C drive circuit.

Period—TP(2)$_3$ (Refer to FIG. 9E)

Next are performed write processing with respect to the drive transistor TR$_D$, and correction (mobility correction processing) of the electric potential of the source region (second node ND$_2$) of the drive transistor TR$_D$ on a basis of the size of the mobility μ of the drive transistor TR$_D$. Specifically, the electric potential of the data line DTL is put to the video signal $V_{Sig}$ for controlling the luminance at the light emission unit ELP while maintaining the "on" state of the write transistor TR$_W$. As a result of this, the electric potential of the first node ND$_1$ rises to $V_{Sig}$, and the drive transistor TR$_D$ changes to an "on" state. Note that the drive transistor TR$_D$ may be put into an "on" state by temporarily putting the write transistor TR$_W$ in an "off" state, changing the electric potential of the data line DTL to the video signal $V_{Sig}$ for controlling the luminance at the light emission unit ELP, and thereafter putting the scanning line SCL at high level, putting the write transistor TR$_W$ in an "on" state.

Unlike what was explained for the 5Tr/1C drive circuit, electric potential $V_{CC-H}$ is applied to the drain region of the drive transistor TR$_D$ from the electric power source unit 2100, and thus the electric potential of the gate electrode of the drive transistor TR$_D$ rises. After a predetermined time (t$_0$) has elapsed, the write transistor TR$_W$ is put in an "off" state and the first node ND$_1$ (the gate electrode of the drive transistor TR$_D$) is put in a floating state by putting the scanning line SCL at low level. Note that the total time t$_0$ of this [period—TP(2)$_3$] may, during design of the display device, be priorly determined as a design value such that the electric potential of the second node ND$_2$ becomes ($V_{Ofs}$−$V_{th}$+ΔV).

In this [period—TP(2)$_3$], in a case where the value of the mobility μ of the drive transistor TR$_D$ is large, the rise quantity ΔV of the electric potential at the source region of the drive transistor TR$_D$ is large, and in a case where the value of the mobility μ of the drive transistor TR$_D$ is small, the rise quantity ΔV of the electric potential at the source region of the drive transistor TR$_D$ is small.

Period—TP(2)$_4$ (Refer to FIG. 9E)

Threshold-voltage cancel processing, write processing, and mobility correction processing are completed by the foregoing operations. Accordingly, the same processing as [period—TP(5)$_7$] described for the 5Tr/1C drive circuit is performed, the electric potential of the second node ND$_2$ rises and exceeds ($V_{th-EL}$+$V_{Cat}$), and thus the light emission unit ELP starts to emit light. At this time, the current flowing through the light emission unit ELP can be obtained using equation (5), and thus the drain current I$_{ds}$ flowing through the light emission unit ELP is not dependent on the threshold voltage $V_{th-EL}$ of the light emission unit ELP or the threshold voltage $V_{th}$ of the drive transistor TR$_D$. That is to say, the amount of light emission (luminance) of the light emission unit ELP is not subject to an effect by the threshold voltage $V_{th-EL}$ of the light emission unit ELP or an effect by the threshold voltage $V_{th}$ of the drive transistor TR$_D$. Moreover, occurrence of variations in the drain current I$_{ds}$ arising from variations in the mobility μ can be suppressed.

Accordingly, the light emission state of the light emission unit ELP continues until the (m+m'−1)th horizontal scanning period. This time point corresponds to the end of [period—TP(2)$_{-1}$].

Light emission operation of light emitting elements 10 constituting (n, m)th sub-pixels is completed by the foregoing.

Figure 10:
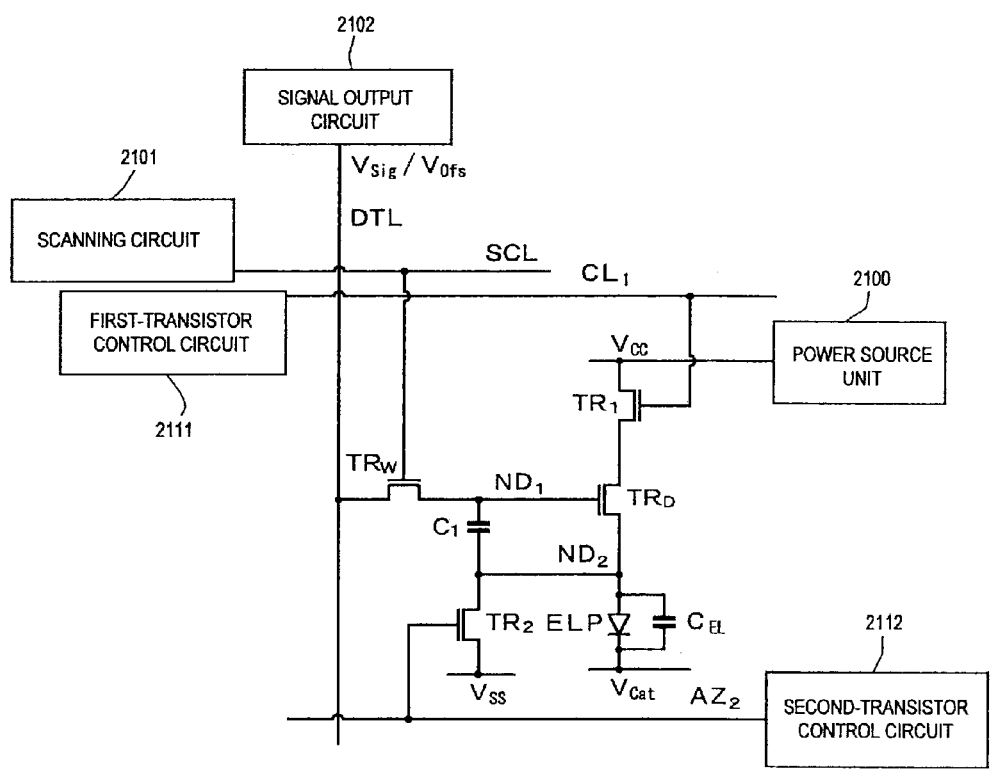
FIG. 10 is an equivalent circuit diagram of a 4Tr/1C drive circuit.
Figure 11:
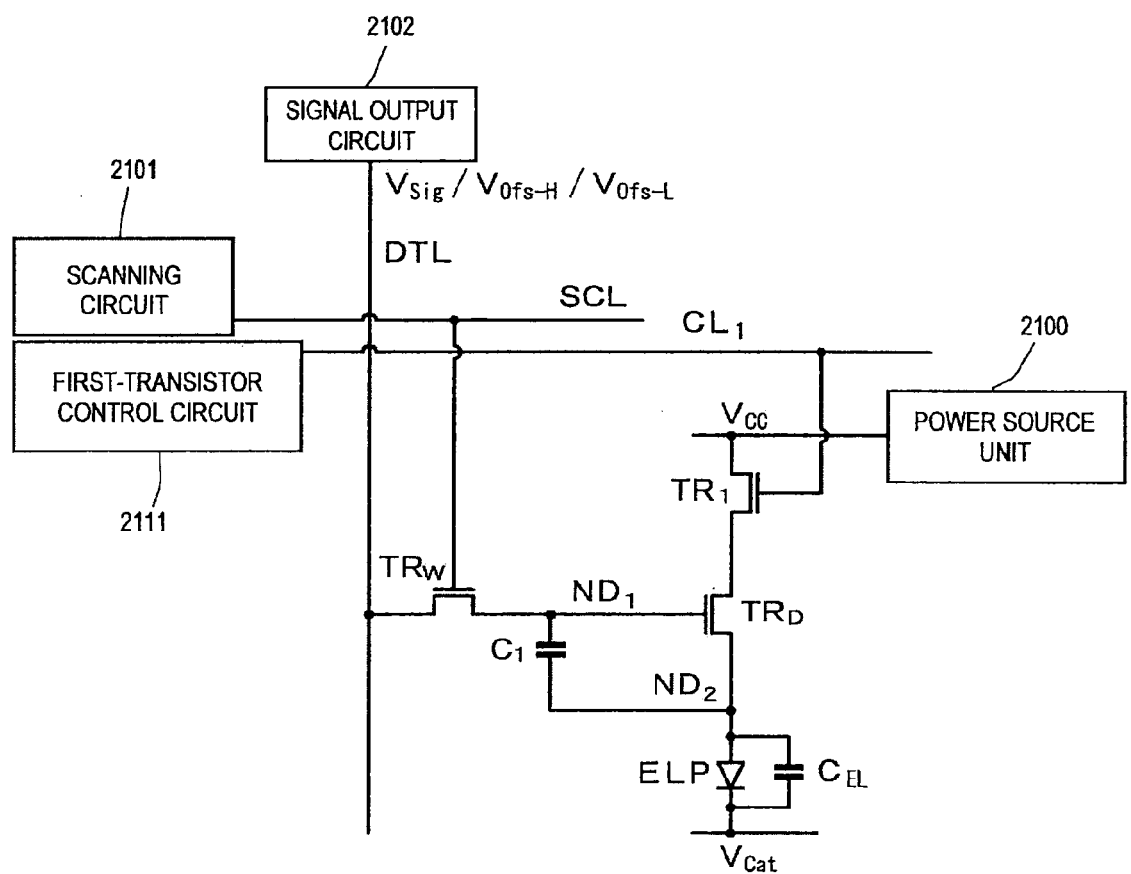
FIG. 11 is an equivalent circuit diagram of a 3Tr/1C drive circuit.

Explanation based on desirable examples was given above, by the structure of the drive circuit according to this invention is not limited to these. The constitution and structure of the respective types of constituent elements making up the display device, light emitting elements, and drive circuit and the steps in the drive method of the light emission unit explained for the respective examples are exemplifications, and can be changed suitably. For example, the 4Tr/1C drive circuit depicted in FIG. 10 or the 3Tr/1C drive circuit depicted in FIG. 11 can be employed as the drive circuit.

Additionally, in the explanation of operation of the 5Tr/1C drive circuit, write processing and mobility correction were performed discretely, but there is no limitation to this. A structure can be used in which mobility correction processing is also performed in write processing, similarly to the explanation of operation of the 2Tr/1C drive circuit. Specifically, a structure may be used that applies a video signal $V_{Sig\_m}$ from the data line DTL to a first node via a write transistor $T_{Sig}$ while a light emission controlling transistor $T_{EL\_C}$ is in an "on" state.

Figure 12:
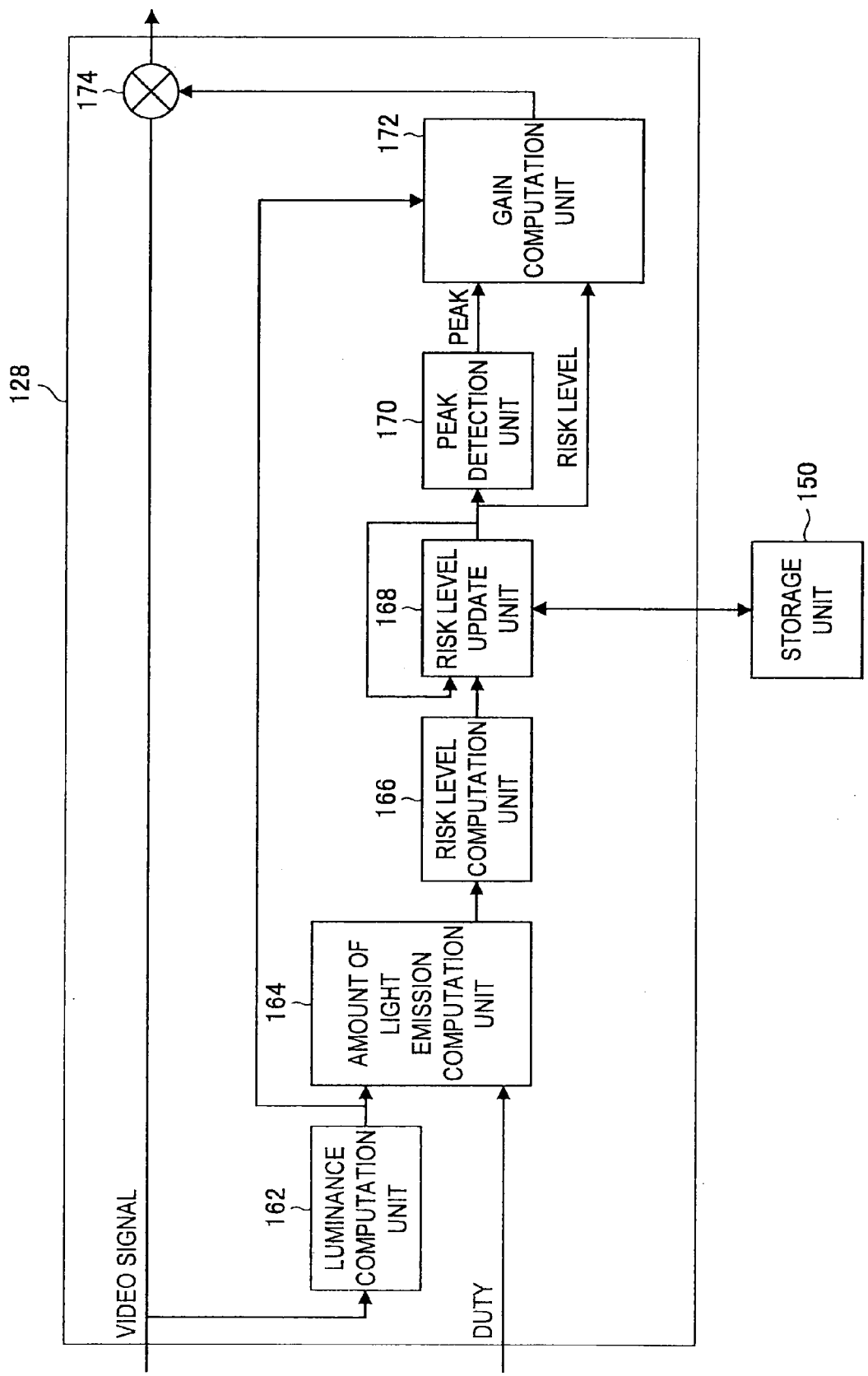
FIG. 12 is an explanatory figure that explains a configuration of a signal level correction unit 128 according to the first embodiment of the present invention.

Next, the configuration of the signal level collection unit 128 according to the first embodiment of the present invention will be explained. FIG. 12 is an explanatory figure that explains the configuration of the signal level correction unit 128 according to the first embodiment of the present invention. The configuration of the signal level correction unit 128 according to the first embodiment of the present invention will be explained below using FIG. 12.

As shown in FIG. 12, the signal level correction unit 128 according to the first embodiment of the present invention is an example of a luminance control portion of the present invention and is configured such that it includes a luminance computation unit 162, an amount of light emission computation unit 164, a risk level computation unit 166, a risk level update unit 168, a peak detection unit 170, a gain computation unit 172, and a multiplier 174.

The luminance computation unit 162 accepts input of the video signal that has been converted by the linear conversion unit 116 to have the linear characteristic and computes a luminance based on the video signal that has been input.

The amount of light emission computation unit 164 accepts as inputs the luminance that has been computed by the luminance computation unit 162 and the pulse duty ratio that has been computed by the light-emission time control unit 126. The amount of light emission computation unit 164 computes an amount of light emission per frame for each of the pixels by multiplying the luminance by the duty ratio (luminance×duty ratio). In the organic EL elements in the OLED panel, There is a linear relationship between the electric current and the amount of light emission. Therefore, computing the luminance based on the video signal and inputting the computed luminance and the pulse duty ratio to the amount of light emission computation unit 164 makes it possible to emit light based on the video signal that is input for each frame and to compute the amount of light emission per frame for each of the pixels in the panel 158.

The risk level computation unit 166 is an example of an amount of light emission parameter computation portion of the present invention, and based on the amount of light emission that is computed by the amount of light emission computation unit 164, it computes an amount of light emission parameter that corresponds to the amount of light emission. The amount of light emission parameter indicates a degree of risk of burn-in of one of a pixel and a group of pixels. Hereinafter, the amount of light emission parameter that is computed by the risk level computation unit 166 will be called the risk level. The risk level that is computed by the risk level computation unit 166 is sent to the risk level update unit 168.

The risk level update unit 168 takes the risk level that the risk level computation unit 166 has computed for each of the one of the pixel and the group of pixels and stores it in the storage unit 150, which is an example of an amount of light emission parameter accumulation portion of the present invention. Accumulating the risk levels that the risk level computation unit 166 computes for each of the one of the pixel and the group of pixels makes it possible to understand the relationships between the risk levels and each of the one of the pixel and the group of pixels on the screen. Information on the risk level for each of the one of the pixel and the group of pixels is called a risk level map.

The way of grouping the pixels when the group of pixels is defined can be freely determined in accordance with the design of the display device, and the present invention is not limited to any specific way of grouping the pixels. The group of pixels may be defined such that it has the same number of pixels in the vertical and horizontal directions, and it may also be defined such that it has different numbers of pixels in the vertical and horizontal directions.

The storage unit 150 is an example of the parameter accumulation portion of the present invention, and it accumulates the risk levels that are computed by the risk level computation unit 166 and stores them as the risk level maps. The risk levels are sequentially accumulated while the display device 100 is operating, and the power supply to the display device 100 is turned off the accumulated risk levels are reset. Therefore, as described previously, it is desirable for a memory in which the contents are deleted when the power is turned off, such as an SDRAM, for example, to be used as the storage unit 150.

Next, a method for computing the risk level in the risk level computation unit 166 according to the first embodiment of the present invention will be explained.

Figure 13:
FIG. 13 is an explanatory figure that shows an example of an image that is displayed on the display device 100 according to the first embodiment of the present invention.
Figure 14A:
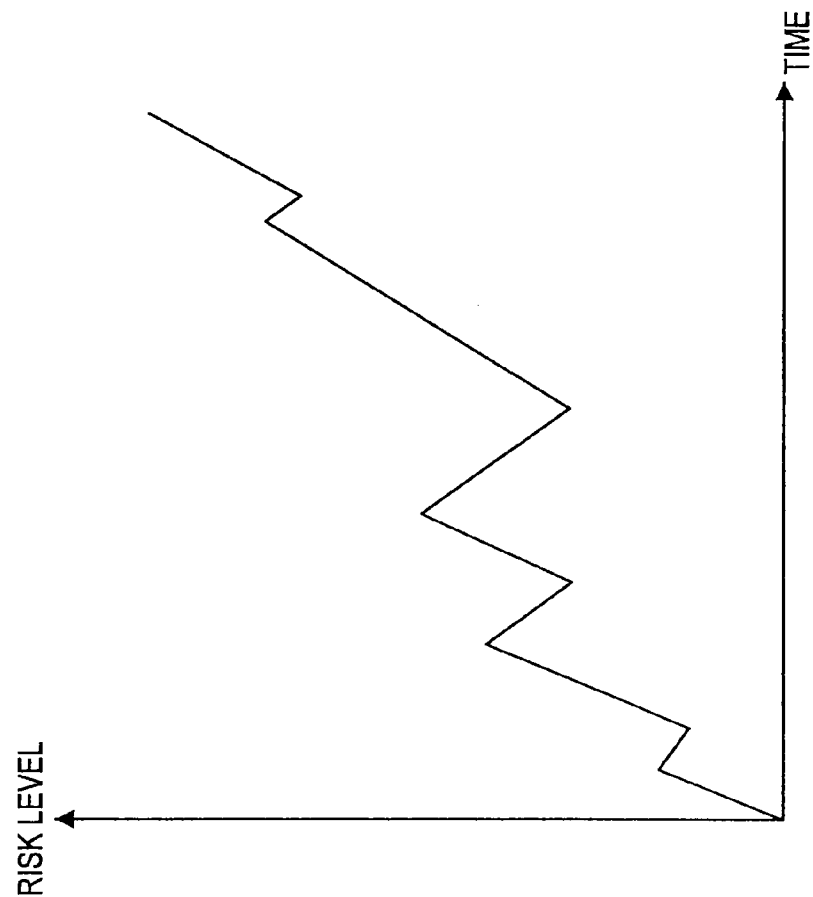
FIG. 14A is an explanatory figure that explains an example of a computation of a risk level by a risk level computation unit 166 according to the first embodiment of the present invention.
Figure 14B:
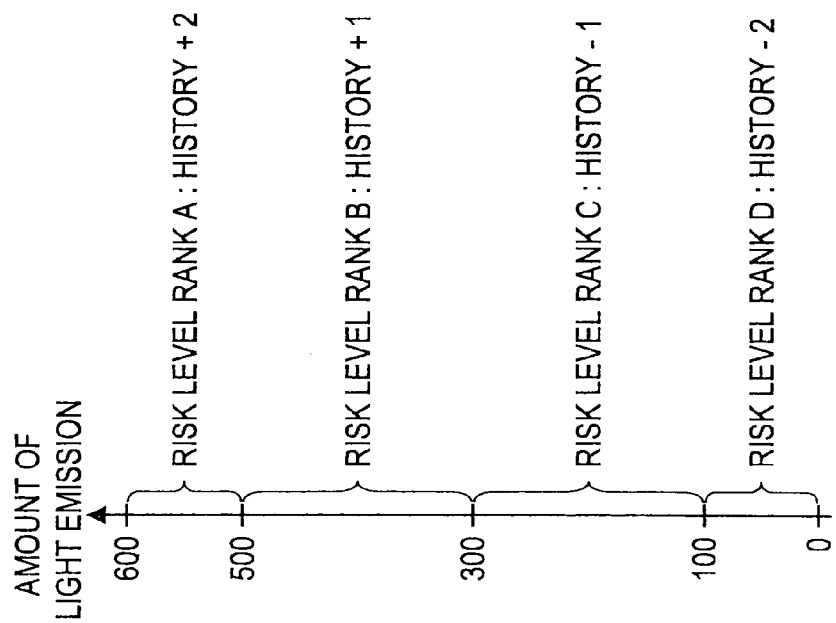
FIG. 14B is an explanatory figure that explains an example of the computation of the risk level by the risk level computation unit 166 according to the first embodiment of the present invention.
Figure 15:
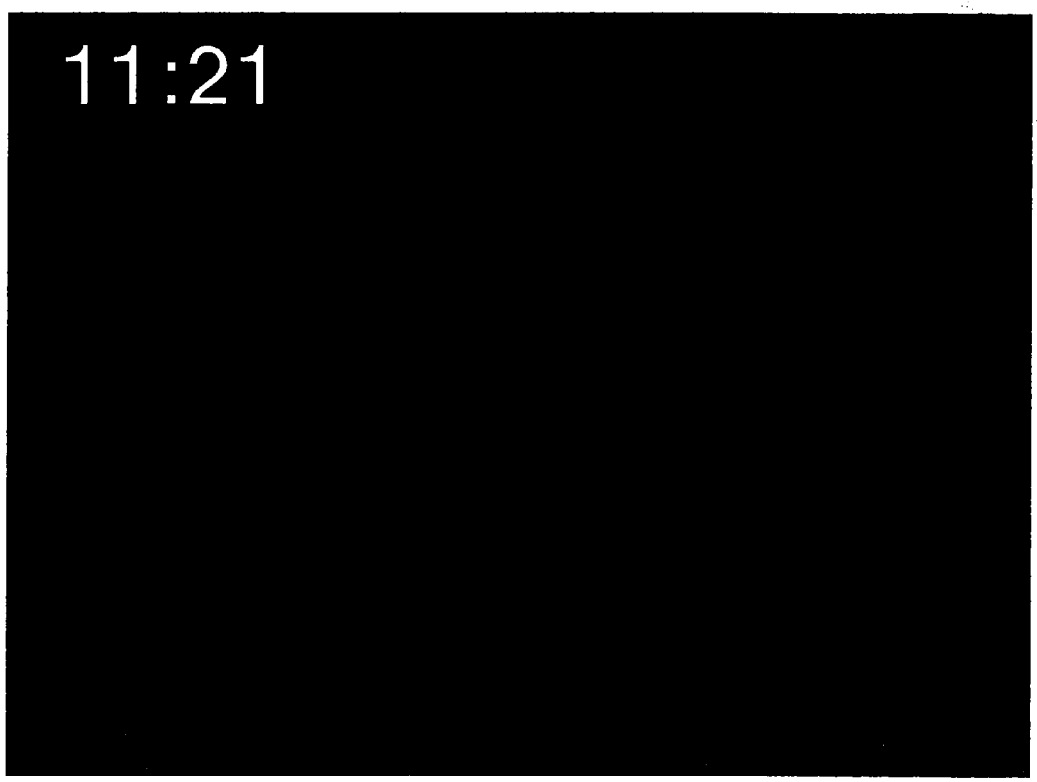
FIG. 15 is an explanatory figure that explains a risk level map according to the first embodiment of the present invention.

FIG. 13 is an explanatory figure that shows an example of an image that is displayed at a specific time on the display device 100 according to the first embodiment of the present invention. FIG. 5 is an explanatory figure that explains an example of the computation of the risk level by the risk level computation unit 166 according to the first embodiment of the present invention. FIGS. 14A and 14B explain how the risk level is computed by detecting the amount of light emission that is computed by the amount of light emission computation unit 164, with a focus on one specific pixel in the panel 158. FIG. 15 is an explanatory figure that explains the risk level map according to the first embodiment of the present invention.

For example, in a case where, at the specific time, the amount of light emission for the one of the pixel and the group of pixels that emits light in accordance with the input of the video signal is from 500 to 600, a determination is made that a rank of the risk level of burn-in is a rank A, and a value of 2 is added to a history of the risk levels for the one of the pixel and the group of pixels. Furthermore, in a case where, at the specific time, the amount of light emission for the one of the pixel and the group of pixels that emits light in accordance with the input of the video signal is from 300 to 500, a determination is made that the rank of the risk level of burn-in is a rank B, and a value of 1 is added to the history of the risk levels for the one of the pixel and the group of pixels.

On the other hand, in a case where, at the specific time, the amount of light emission for the one of the pixel and the group of pixels that emits light in accordance with the input of the video signal is from 100 to 300, a determination is made that the rank of the risk level of burn-in is a rank C, and a value of 1 is subtracted from the history of the risk levels for the one of the pixel and the group of pixels. Furthermore, in a cage where, at the specific time, the amount of light emission for the one of the pixel and the group of pixels that emits light in accordance with the input of the video signal is from zero to 100, a determination is made that the rank of the risk level of burn-in is a rank D, and a value of 2 is subtracted from the history of the risk levels for the one of the pixel and the group of pixels.

Thus the amount of light emission from a unit of the one of the pixel and the group of pixels is detected for a specified time interval, and during the time that the power supply to the display device 100 is on, the risk level for the entire screen continues to be computed by repeatedly adding to and subtracting from the history of the risk levels for the one of the pixel and the group of pixels, based on the detected amount of light emission. The detection of the amount of light emission may be done for every frame, and it may also be done at intervals of a specified number of frames.

The computing of the risk level for the entire screen makes it possible to compute the risk level for all of the one of the pixels and the groups of pixels. Further, associating the risk levels with the positions of the one of the pixels and the groups of pixels on the screen makes it possible to create the risk level map.

To explain this using as an example the image that is shown in FIG. 13, the time display at the upper left in the image in FIG. 13 is constantly displayed on the screen. Moreover, the time display is constantly displayed at a fairly high luminance, so the rank of the risk level for burn-in is high for the pixels that display the time, and the risk level will rise with the passage of time for as long as the time continues to be displayed.

FIG. 15 shows that, in the risk level map, the risk levels for the pixels that display the time have increased. For the pixels outside of the time display, the displayed image changes, so the amount of increase in the risk levels is not great, but the risk levels for the pixels in the time display rise with the passage of time for as long as the time continues to be displayed, so in the risk level map, the values for the risk levels for the pixels in the time display have become greater.

Note that the relationship between the risk level and the position of the one of the pixel and the groups of pixels has been explained in the form of the risk level map to make it easier to understand, but in the storage unit 150, position information for the one of the pixel and the groups of pixels and risk level information are stored in association with one another.

Note that the relationship between the amount of light emission and the risk level and the relationship between the risk level and the history are obviously not limited to the relationships that are described above. The risk levels that are set for specific ranges of the amount of light emission, and the additions and subtractions that are made with respect to the history, can be freely determined in accordance with the design of the display device.

The method for computing the risk level in the risk level computation unit 166 according to the first embodiment of the present invention has been explained above. Note that in a case where the unit for which the risk level is computed is the group of pixels, the unit for which the amount of light emission computation unit 164 computes the amount of light emission may also be the group of pixels.

The peak detection unit 170 accepts as input the risk level map that has been produced by accumulating the risk levels from the storage unit 150, and based on the risk level map that is input, the peak detection unit 170 detects and outputs both the position of the one of the pixel and the group of pixels that has a peak risk level and the value of the risk level. The position of the one of the pixel and the group of pixels and the value of the risk level that are detected by the peak detection unit 170 are output to the gain computation unit 172.

The gain computation unit 172 is an example of a coefficient computation portion of the present invention, and it accepts as inputs the luminance that has been computed by the luminance computation unit 162, the peak value that has been detected by the peak detection unit 170, and the risk level that is stored in the storage unit 150. Based on the information that is input, the gain computation unit 172 computes a gain for multiplying the video signal in the multiplier 174. The gain that is computed by the gain computation unit 172 is input to the multiplier 174, and correction is performed on the video signal that is input to the multiplier 174. The method by which the gain is computed in the gain computation unit 172 will be described in detail later.

The multiplier 174 accepts as input the video signal and the gain that has been computed gain computation unit 172, multiplies the video signal by the gain, and outputs the multiplied video signal.

The configuration of the signal level correction unit 128 according to the first embodiment of the present invention has been explained above using FIG. 12. Next, a drive method of the display device 100 according to the first embodiment of the present invention will be explained.

Figure 16:
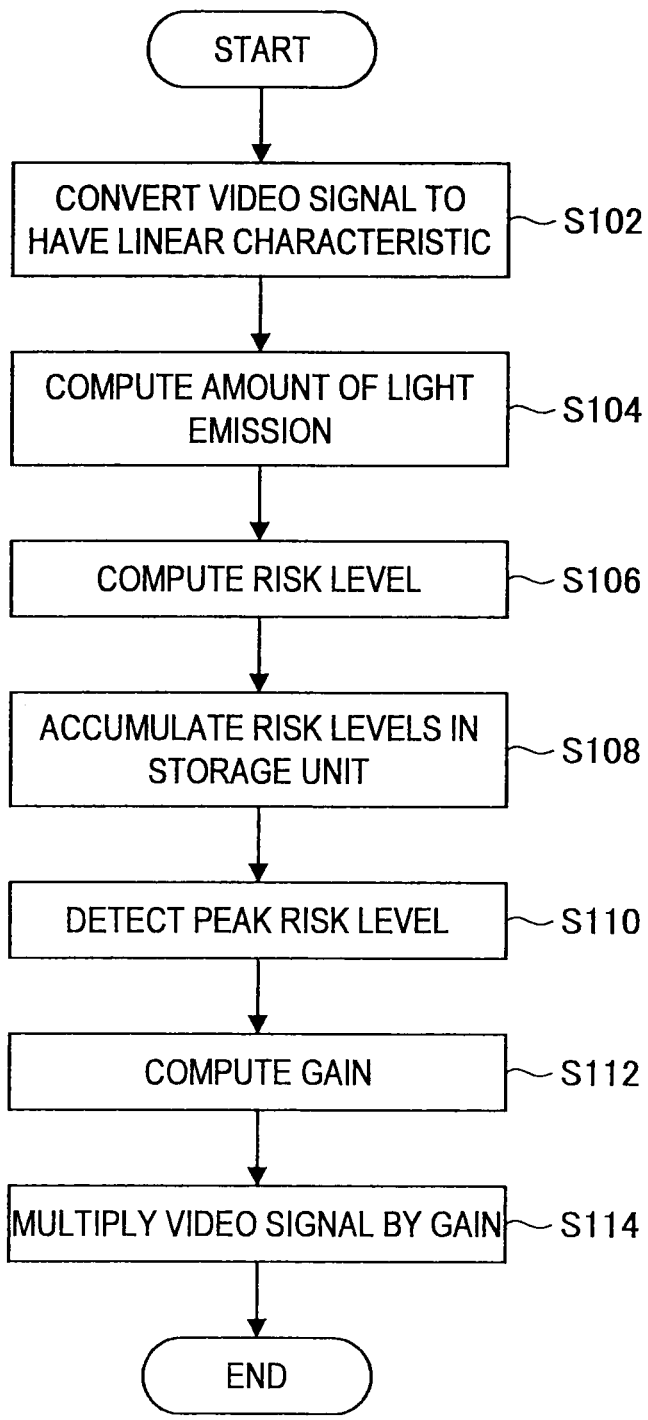
FIG. 16 is a flowchart that explains a drive method of the display device 100 according to the first embodiment of the present invention.

FIG. 16 is a flowchart that explains the drive method of the display device 100 according to the first embodiment of the present invention. Hereinafter, the drive method of the display device 100 according to the first embodiment of the present invention will be explained in detail using FIG. 16.

First, the conversion processing of the video signal that has the gamma characteristic such that it has the linear characteristic is performed by the linear conversion unit 116 (Step S102). In the present embodiment, the conversion processing by the linear conversion unit 116 widens the video signal from 10 bits to 14 bits.

The video signal that has been converted such that it has the linear characteristic is input to the amount of light emission computation unit 164. The amount of light emission computation unit 164 computes the amount of light emission based on the video signal that is input (Step S104). The video signal that is input to the amount of light emission computation unit 164 has the linear characteristic, so the amount of light emission in the panel 158 can be determined based on the magnitude of the signal.

The amount of light emission is determined for one of each pixel and each group of pixels that contains a specified number of pixels. The determined amount of light emission is sent to the risk level computation unit 166 in association with one of the pixel and the group of pixels. The risk level computation unit 166 detects whether or not the amount of light emission for the one of the pixel and the group of pixels exceeds a specified value, and if the amount of light emission exceeds the specified value, the excess value is computed as the risk level (Step S106).

Once the risk level has been computed by the risk level computation unit 166, the computed risk level is sent to the risk level update unit 168. The risk level update unit 168 accumulates, in the storage unit 150, the risk levels for one of each of the pixels and each of the groups of pixels in the form of the risk level map that is described above (Step S108). The risk levels for one of each of the pixels and each of the groups of pixels are sequentially accumulated in the storage unit 150 during the time that the power supply of the display device 100 is on. The accumulated risk levels are sent to the risk level update unit 168 and are used to adjust the luminance of the image that is displayed on the panel 158.

Once the risk levels have been accumulated in the storage unit 150, the adjustment of the luminance of the image that is displayed on the panel 158 is performed based on the information in the risk level map that has been created by the accumulation of the risk levels. The created risk level map is sent from the risk level update unit 168 to the peak detection unit 170, and the peak detection unit 170 detects the one of the pixel and the group of pixels that has the peak risk level in the risk level map (Step S110).

Once the peak detection unit 170 detects the one of the pixel and the group of pixels that has the peak risk level in the risk level map, the video signal, the risk level, and the one of the pixel and the group of pixels that has the peak risk level are input to the gain computation unit 172, where the gain is computed using the information that has been input (Step S112).

The gain that is computed by the gain computation unit 172 is a gain for reducing the luminance of the one of the pixel and the group of pixels that has the peak risk level to such a degree that the burn-in phenomenon does not occur. A gain that reduces the luminance of the entire screen may also be computed in addition to the gain for the one of the pixel and the group of pixels that has the peak risk level.

Once the gain has been computed by the gain computation unit 172, the computed gain is input to the multiplier 174, where the video signal is multiplied by the gain (Step S114). In a case where the gain computation unit 172 has computed the gain that reduces the luminance of the entire screen, in addition to the gain for the one of the pixel and the group of pixels that has the peak risk level, the multiplier 174 multiplies the video signal by the gain that reduces the luminance of the entire screen and also multiplies the video signal by the gain for the one of the pixel and the group of pixels that has the peak risk level.

In a case where the gain that reduces the luminance of the entire screen (hereinafter called a first coefficient) and the gain for the one of the pixel and the group of pixels that has the peak risk level (hereinafter called a second coefficient) are both computed, the video signals that are input to all of the pixels may be multiplied by the first coefficient, and the video signals that have been multiplied by the first coefficient may be input to the one of the pixel and the group of pixels that has the peak risk level and may be multiplied by the second coefficient, and alternatively, the video signals that are input to all of the pixels except the one of the pixel and the group of pixels that has the peak risk level may be multiplied by the first coefficient, and the video signals that are input to the one of the pixel and the group of pixels that has the peak risk level may be multiplied by the second coefficient.

In this manner, the detecting of the one of the pixel and the group of pixels that has the peak risk level in the risk level map and the computing of the gain that will reduce the luminance of the one of the pixel and the group of pixels make it possible to inhibit the burn-in phenomenon for the pixels that continuously emit bright light. Furthermore, additionally computing the gain that reduces the luminance of the entire screen makes it possible to prevent the video image from becoming unnatural due to the reducing of the luminance only for the specific one of the pixel and the group of pixels (that has the peak risk level).

An example of the method for computing the gain in the gain computation unit 172 will be explained in greater detail.

Figure 17:
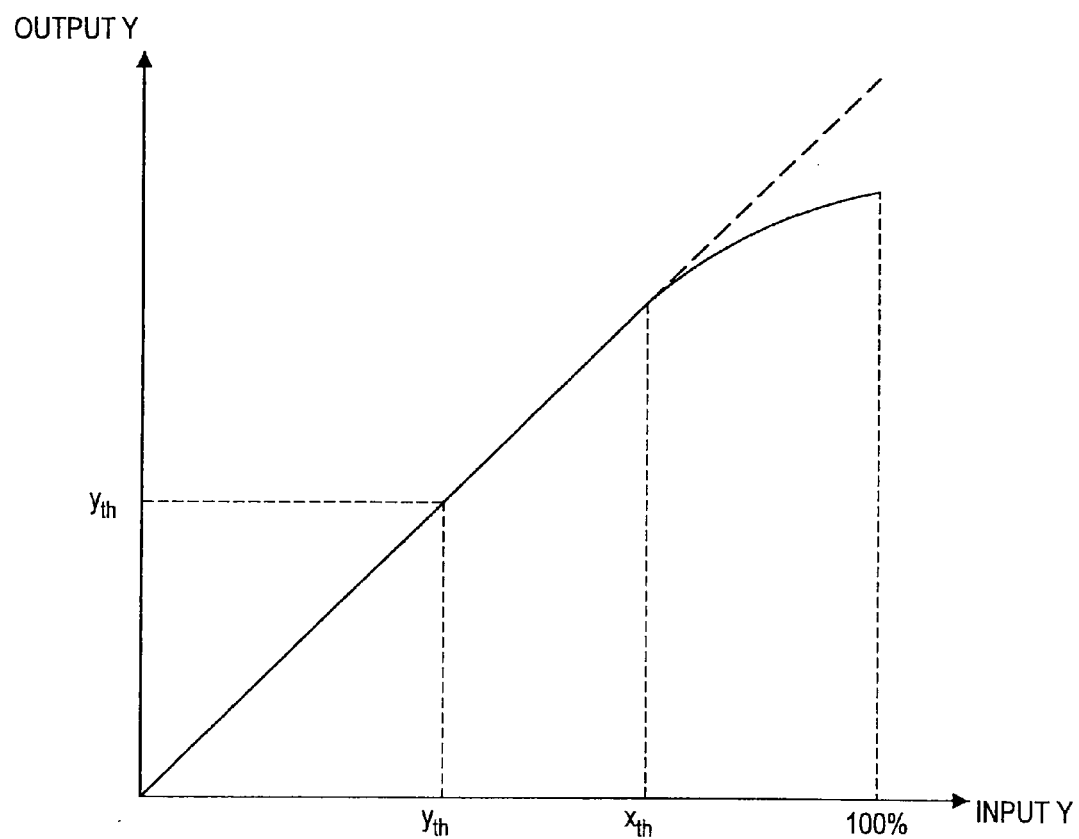
FIG. 17 is an explanatory figure that shows, in the form of a graph, a relationship between an input luminance and an output luminance in the signal level correction unit 128 according to the first embodiment of the present invention.

FIG. 17 is an explanatory figure that shows, in the form of a graph, an example of a relationship between the luminance of the video signal that is input to the signal level correction unit 128 according to the first embodiment of the present invention (an input luminance) and the luminance of the video signal that is output from the signal level correction unit 128 (an output luminance). In the present embodiment, the computing of the gain is performed in the gain computation unit 172 such that the input/output relationship that is shown in FIG. 17 is created.

In the present embodiment, as shown in FIG. 17, the gain is computed such that an input luminance and an output luminance are the same until the input luminance reaches $x_{th}$. However, when the input luminance reaches $x_{th}$, the gain is computed such that the relationship between the input luminance and the output luminance becomes a quadratic curve.

In FIG. 17, the input luminance at which the gain starts to diminish is defined as $x_{th}$ (the relationship between the video signal and the luminance has a linear characteristic, so the luminance is proportional to the signal level of the video signal that is input to the luminance computation unit 162). The value of $x_{th}$ varies dynamically according to the value of the risk level. If riskpeak is the peak value of the risk level and riskpeak_max is the maximum value of the peak value of the risk level that is used in the computing of the gain, then riskpeak', the peak value of the risk level that is used in the computing of the gain, can be expressed such that it is not greater than the value of riskpeak_max.

Equation 1 riskpeak'=riskpeak(riskpeak≤riskpeak_max)

riskpeak'=riskpeak_max (riskpeak>riskpeak_max)  (6)

If riskpeak', the peak value of the risk level, is used, then risk', the risk level value that is used in the computing of the gain, can be expressed such that it is not greater than the value of riskpeak'.

Equation 2 risk'=risk(risk>riskpeak')

risk'=riskpeak'(risk≤riskpeak')  (7)

This means that, because the signal level $x_{th}$ at which the gain starts to diminish varies dynamically according to risk', the value of the risk level, $x_{th}$ can be expressed as a function of risk', that is $x_{th}$ (risk'). The function $x_{th}$ (risk') can be expressed as shown below by using $x_{th\_max}$ for the value of $x_{th}$ when the risk level is at the maximum, risk-stt for the value of the risk level at which the gain starts to diminish, and risk_max for the maximum value of the risk level.

Equation 3

$x_{th}$(risk')=1−((risk'−risk)/(risk_max−risk-*stt*))×(1−$x_{th\_max}$(risk'≥risk-*stt*)

$x_{th}$(risk')=1(risk'<risk-stt)  (8)

Accordingly, the gain that is computed by the gain computation unit 172 varies such that it is not greater than $x_{th}$.

Figure 18:
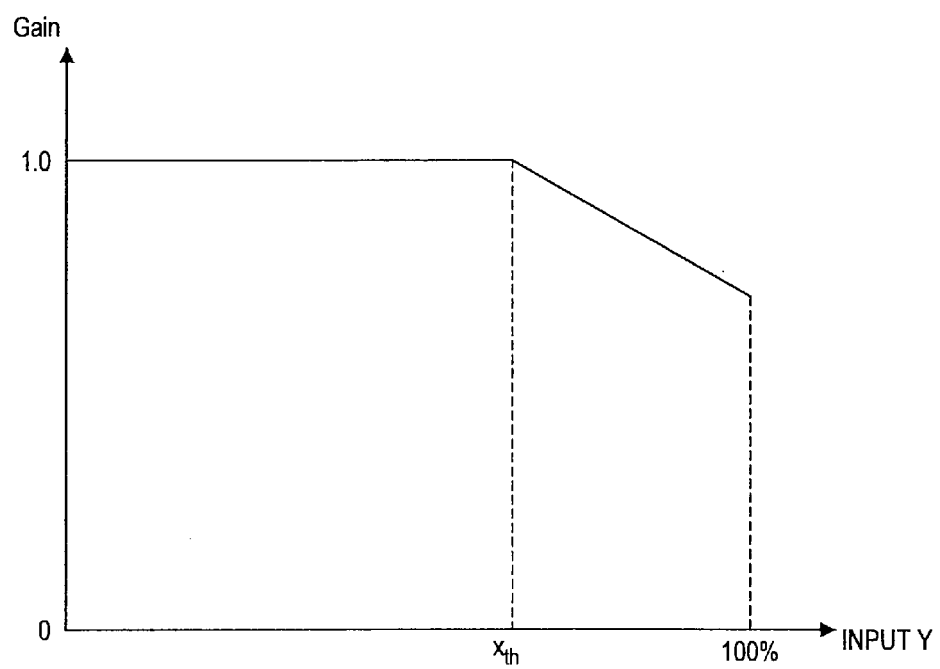
FIG. 18 is an explanatory figure that shows, in the form of a graph, a relationship between the input luminance and a gain in the signal level correction unit 128 according to the first embodiment of the present invention.

FIG. 18 is an explanatory figure that shows, in the form of a graph, an example of a relationship between the luminance of the video signal that is input to the signal level correction unit 128 according to the first embodiment of the present invention (the input luminance) and the gain. As shown in FIG. 18, if the signal level of the input luminance is less than $x_{th}$, the gain is 1, that is, the input luminance is output without being reduced. On the other hand, if the value of the input luminance is not less than $x_{th}$, the value of the gain decreases as the luminance increases.

Figure 19:
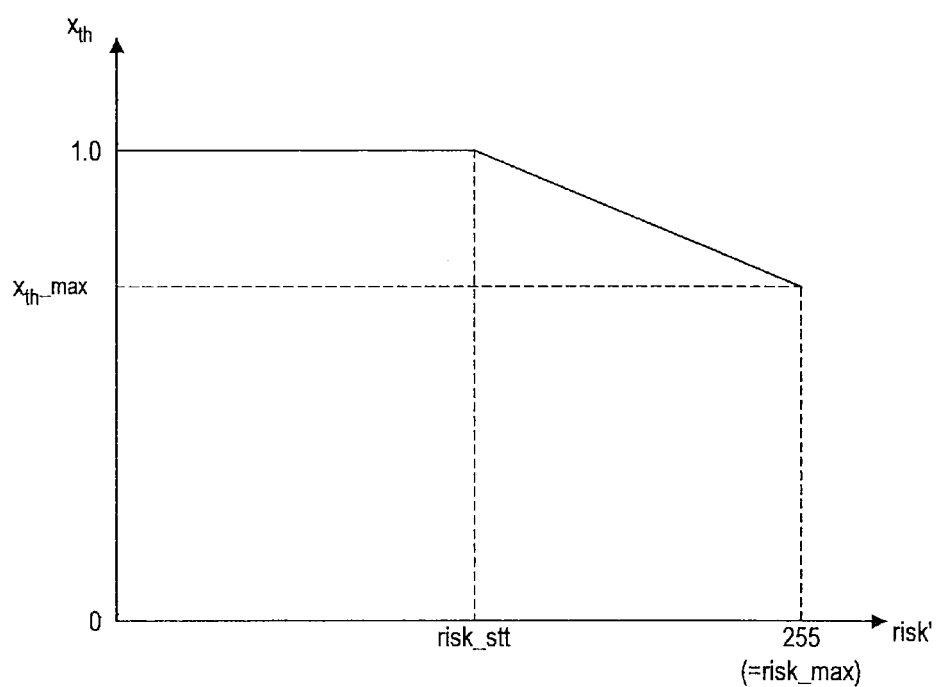
FIG. 19 is an explanatory figure that shows, in the form of a graph, a relationship between a risk level value that is used in computing the gain and a signal level at which the gain starts to diminish, according to the first embodiment of the present invention.

FIG. 19 is an explanatory figure that shows, in the form of a graph, an example of a relationship between a risk level value risk' that is used in computing the gain and the signal level $x_{th}$ at which the gain starts to diminish, according to the first embodiment of the present invention. As shown in FIG. 19, until the value of risk' reaches risk_stt, the risk level value at which the gain starts to diminish, the value of $x_{th}$ is 1.0, that is, the same value as the signal level of the video signal that is input to the signal level correction unit 128. Once the value of risk' becomes not less than risk_stt, the risk level value at which the gain starts to diminish, the value of $x_{th}$ decreases gradually.

Therefore, if an image of not less than a specified luminance is continuously output to one of a pixel and a group of pixels on the screen, the risk level increases, and the signal level $x_{th}$ at which the gain starts to diminish decreases as the risk level increases. In other words, in FIG. 17, the position of $x_{th}$ shifts to the left as the risk level increases, so if the risk level increases, the gain is computed in the gain computation unit 172 in order to reduce the luminance of the video signal that is output, even if the luminance of the video signal that is input to the signal level correction unit 128 (the input luminance) is low.

The method for computing the gain in the gain computation unit 172 has been explained above. Note that the method for computing the gain in the gain computation unit 172 is obviously not limited to the example that has been explained. In a case where the gain that reduces the luminance of the entire screen (the first coefficient) and the gain for the one of the pixel and the group of pixels that has the peak risk level (the second coefficient) are both computed, two risk level values may be set as the reference points at which the gain starts to diminish. Furthermore, computing the gains separately for the one of the pixel and the group of pixels that has the peak risk level and for one of other pixels and other groups of pixels, then sending the computed gains to the multiplier 174, makes it possible to decrease the luminance of the entire screen, not only the one of the pixel and the group of pixels that has the peak risk level, and thus to inhibit the burn-in phenomenon without making the user who is looking at the image on the display device 100 feel that anything is amiss.

Note that in FIG. 16, the sequential flow of the drive method of the display device 100 according to the first embodiment of the present invention is explained, but as described above, in the drive method of the display device 100 according to the first embodiment of the present invention, the risk levels are computed and accumulated at specified intervals for as long as the power supply of the display device 100 is on.

The drive method of the display device 100 according to the first embodiment of the present invention has been explained above. Note that the drive method of the display device 100 according to the first embodiment of the present invention that is described above may also be implemented by recording in advance in an internal recording medium of the display device 100 (for example, the recording unit 106) a computer program that has been created such that it implements the drive method of the display device 100 according to the first embodiment of the present invention, and then having a computing device (for example, the control unit 104) read the computer program sequentially and execute the computer program.

As explained above, according to the display device 100 according to the first embodiment of the present invention and according to the drive method of the display device 100, the computing of the amount of light emission for each pixel based on the video signal and the pulse, the computing of the gain such that the amount of light emission will be curtailed for the one of the pixel and the group of pixels that emits light in excess of the specified amount of light emission, and the multiplying of the video signal by the computed gain make it possible to inhibit the burn-in phenomenon on the screen and make it possible to slow the deterioration of the light emitting elements.

Furthermore, the gradual diminishing of the gain by the gain computation unit 172 as the risk level values accumulate makes it possible to avoid causing the user who is looking at a video image on the display device 100 to sense any change in the luminance of the video image that is displayed on the screen.

Moreover, in the self-illuminating type light emitting element such as the organic EL element, the relationship between the electric current and the amount of light emission has a linear characteristic, so knowing the amount of the electric current makes it possible to determine the amount of light emission for the light emitting element. Therefore, the detecting of the amount of light emission makes it possible to inhibit the burn-in phenomenon by determining the amount of the electric current in advance, without performing feedback, unlike the known display device that inhibits the burn-in phenomenon.

Second Embodiment

In the first embodiment of the present invention, a case was explained in which the gain that reduces the luminance of the entire screen (the first coefficient) and the gain for the one of the pixel and the group of pixels that has the peak risk level (the second coefficient) are both computed, but in a case where both the first coefficient and the second coefficient are computed in this manner, the phenomenon that is described below may occur.

For example, in a case where the video signal is multiplied by the two types of gain, if a video signal is input such that the entire screen displays a bright, flat image, the one of the pixel and the group of pixels that has the peak risk level that is multiplied by the second coefficient may appear to be burned in.

Accordingly, in the second embodiment of the present invention, a display device will be explained in which, when the second coefficient is computed, an average value is computed for the amount of light emission for the pixels that surround the one of the pixel and the group of pixels that has the peak risk level, and the second coefficient is computed based on the computed average value, making it possible to inhibit the burn-in.

Figure 20:
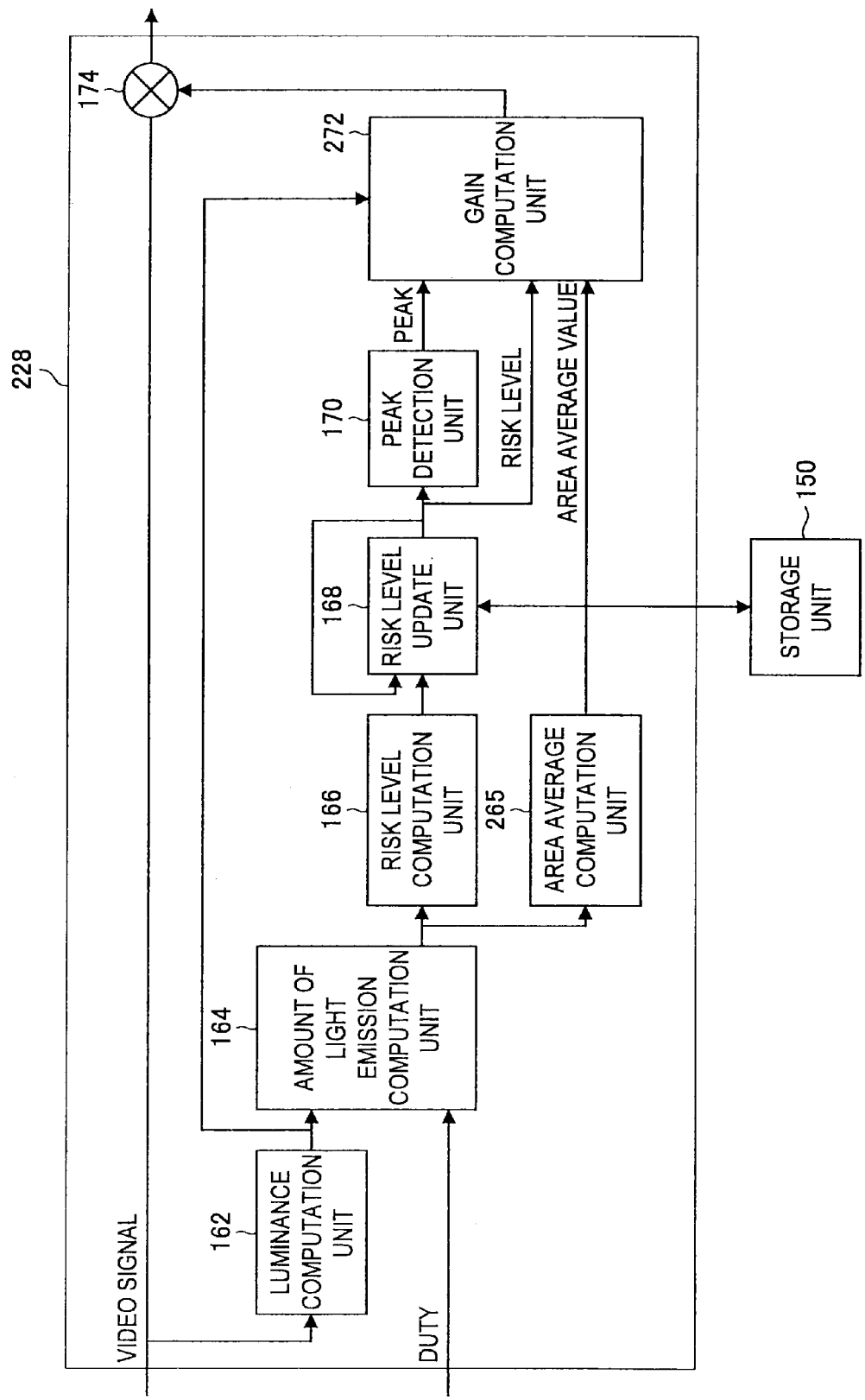
FIG. 20 is an explanatory figure that explains a configuration of a signal level correction unit 228 according to a second embodiment of the present invention.

FIG. 20 is an explanatory figure that explains a configuration of a signal level correction unit 228 according to the second embodiment of the present invention. Hereinafter, the configuration of the signal level collection unit 228 according to the second embodiment of the present invention will be explained using FIG. 20.

As shown in FIG. 20, the signal level correction unit 228 is configured such that it includes the luminance computation unit 162, the amount of light emission computation unit 164, the risk level computation unit 166, the risk level update unit 168, the peak detection unit 170, a gain computation unit 272, the multiplier 174, and an area average computation unit 265.

Of these, the luminance computation unit 162, the amount of light emission computation unit 164, the risk level computation unit 166, the risk level update unit 168, the peak detection unit 170, and the multiplier 174 are the same as those that were explained for the first embodiment of the present invention, so here, the gain computation unit 272 and the area average computation unit 265 that are the structural elements that are different from the first embodiment of the present invention will be explained.

Figure 21:
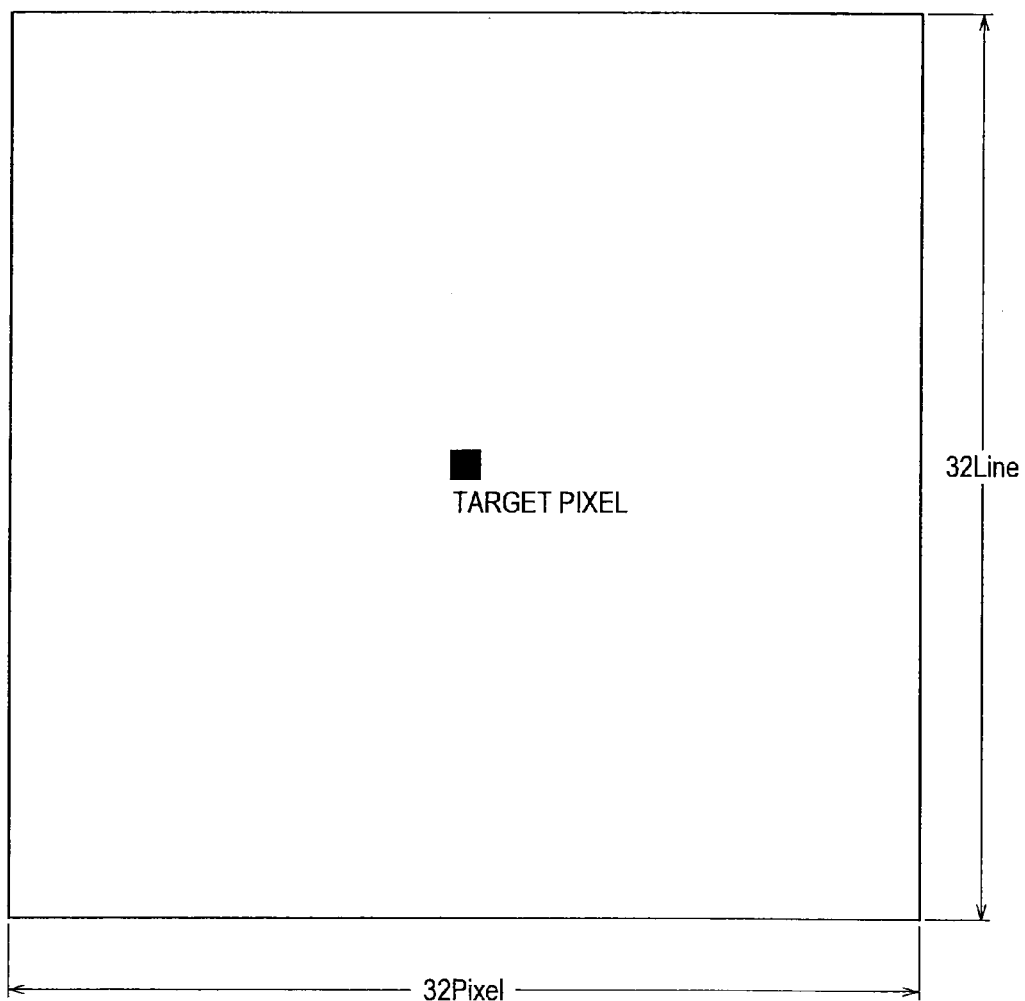
FIG. 21 is an explanatory figure that explains an area for which an average value of an amount of light emission is determined in an area average computation unit 265 according to the second embodiment of the present invention.

The area average computation unit 265 uses the amount of light emission that is computed for each pixel by the amount of light emission computation unit 164 to compute an average value (an area average value) of the amount of light emission in a specified area that includes a target pixel. FIG. 21 is an explanatory figure that explains the area for which the average value of the amount of light emission is determined in the area average computation unit 265 according to the second embodiment of the present invention. In the present embodiment, as shown in FIG. 21, the average value is computed for the amount of light emission from an area that is 32 pixels wide and 32 lines high, for example, and that has the target pixel at its center. The area average value of the amount of light emission that is computed by the area average computation unit 265 is input to the gain computation unit 272. Note that the area for which the area average value of the amount of light emission is computed is not limited to being an that is 32 pixels wide and 32 lines high.

The gain computation unit 272 is an example of the coefficient computation portion of the present invention, and it accepts as inputs the luminance that has been computed by the luminance computation unit 162, the peak value that has been detected by the peak detection unit 170, the risk level that is stored in the storage unit 150, and the area average value of the amount of light emission that is computed by the area average computation unit 265. Based on the information that is input, the gain computation unit 272 computes a gain for multiplying the video signal in the multiplier 174.

The configuration of the signal level correction unit 228 according to the second embodiment of the present invention has been explained above. Next, a coefficient computation method according to the second embodiment of the present invention will be explained.

In the first embodiment of the present invention, as shown in equation (7), risk, the risk level, is compared with riskpeak', the peak value of the risk level, and the larger of the two is used in the computing of the gain, but in the second embodiment of the present invention, the computing of the gain is done by taking into consideration the area average value of the amount of light emission that is computed by the area average computation unit 265.

In the gain computation unit 272, the method for determining riskpeak', the peak value of the risk level that is used in the computing of the gain, uses riskpeak, the peak value of the risk level, and riskpeak_max, the maximum value of the peak value of the risk level, in the same manner as in the first embodiment of the present invention.

A feature of the second embodiment of the present invention is that a third coefficient (hereinafter called an area gain) is determined using the area average value of the amount of light emission that is computed by the area average computation unit 265, and the third coefficient varies the second coefficient according to the value of the area average value.

Figure 22:
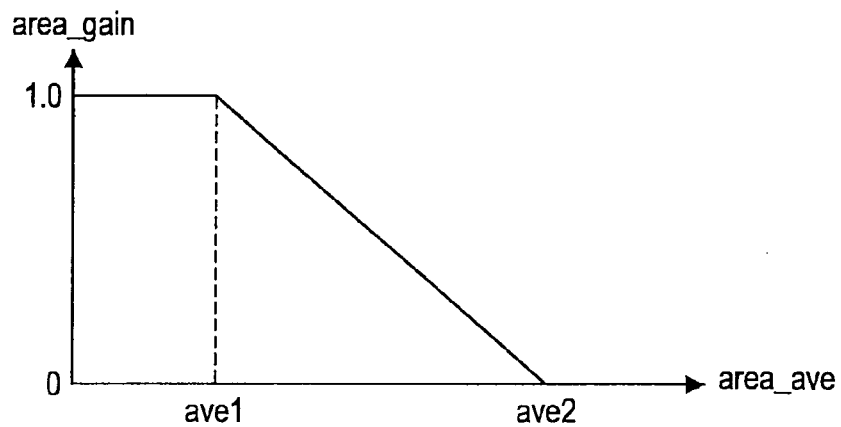
FIG. 22 is an explanatory figure that explains an example of a characteristic of an area gain according to the second embodiment of the present invention.

The area gain may have a characteristic such that it is directly proportional to the area average value of the amount of light emission, and the area gain may also have a characteristic such that it is 1.0 when the value of the area average value of the amount of light emission is from zero to a specified value, and such that it is directly proportional to the area average value of the amount of light emission when the value of the area average value of the amount of light emission is greater than the specified value. FIG. 22 is an explanatory figure that explains an example of the characteristic of the area gain according to the second embodiment of the present invention. In the graph that is shown in FIG. 22, the horizontal axis is area_ave, the area average value of the amount of light emission, and the vertical axis is area_gain, the area gain.

As shown in FIG. 22, when area_ave is from zero to 1, area_gain is 1.0. When area_ave becomes at least ave1, the value of area_gain decreases, and when area_ave becomes ave2, the value of area gain reaches zero. The value of the risk level risk' that is used in the computing of the gain is computed using the value of area_gain that is determined in this manner.

The value of the risk level that is determined using area_gain, the area gain that is derived from the area average value, is called risk_new. The value of risk_new is defined by the equation below.

Equation 4

$$risk\_new = (riskpeak' - risk) \times area\_gain + riskpeak' \quad (9)$$

Figure 23:
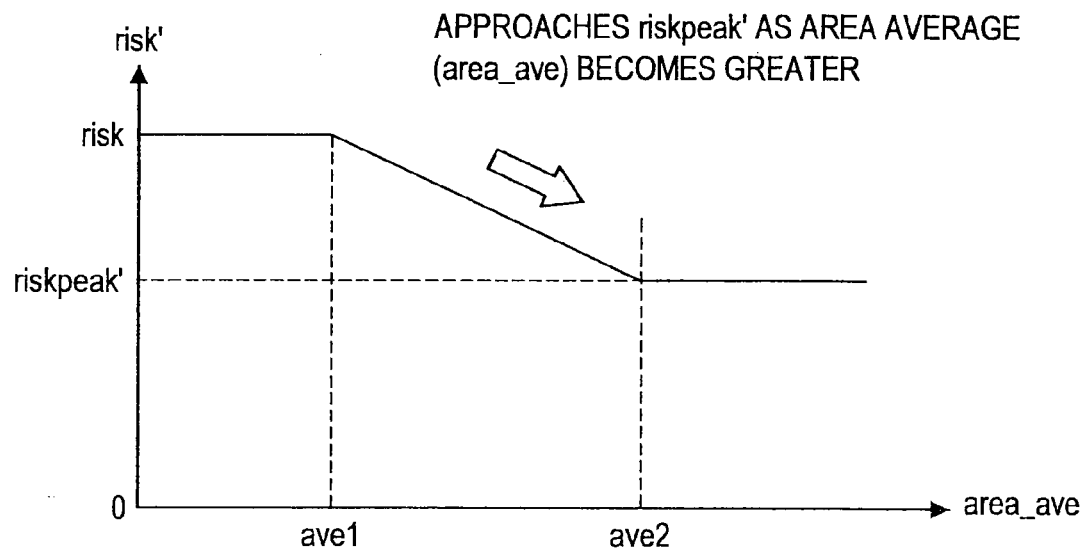
FIG. 23 is an explanatory figure that explains a characteristic of a risk level value that is determined using the area gain according to the second embodiment of the present invention.

FIG. 23 is an explanatory figure that explains a characteristic of the value of the risk level that is determined using the area gain according to the second embodiment of the present invention. In the graph that is shown in FIG. 23, the horizontal axis is area_ave, the area average value of the amount of light emission, and the vertical axis is risk new, the value of the risk level that is determined using the area gain.

As shown in FIG. 23, when area_ave is from zero to 1, the value of risk_new remains constant When area_ave becomes at least ave1, the value of risk_new decreases, and when area_ave becomes ave2, the value of risk_new becomes the same as the value of riskpeak'.

That is, in a case where the value of area_ave is low, in other words, in a case where the average value of the amount of light emission is low for the area that surrounds the one of the pixel and the group of pixels that has the peak risk level, a value that is the same as that of risk is used in the computing of the gain. As the value of area_ave becomes greater, a value that gradually decreases from the value of risk is used in the computing of the gain. Then, when the value of area_ave becomes at least a specified value, in other words, in a case where the average value of the amount of light emission is high for the area that surrounds the one of the pixel and the group of pixels that has the peak risk level, the value of riskpeak' is used in the computing of the gain.

The choice of which value, riskpeak' or risk_new, will be used for risk', the value of the risk level that is used in the computing of the gain, is determined by the relationship between the value of risk and the value of riskpeak'. The value of risk', the risk level that is used in the computing of the gain, is expressed as shown below.

Equation 5

$$risk' = risk\_new (risk > riskpeak')$$

$$risk' = riskpeak' (risk \le riskpeak') \quad (10)$$

The method for computing the coefficients based on the value of risk' that is expressed as shown in equation (10) was explained in the first embodiment of the present invention, and because the method for computing the coefficients based on the value of risk' is the same, a detailed explanation will be omitted.

The determining of the third coefficient that varies the second coefficient according to the value of the area average value and the decreasing, by the second coefficient, of the luminance of the image that is displayed in the one of the pixel and the group of pixels that has the peak value of the risk level make it possible to inhibit the burn-in of the screen and also make it possible to prevent the one of the pixel and the group of pixels that has the peak risk level from appearing to be burned in, even in a case where the video signal is input such that the entire screen displays a bright, flat image.

Third Embodiment

In the first embodiment and the second embodiment of the present invention, the display device that was explained inhibits the burn-in phenomenon on the screen by determining the first coefficient that decreases the luminance of the entire screen and the second coefficient that decreases the luminance for the one of the pixel and the group of pixels that has the peak risk level. In a third embodiment of the present invention, a display device will be explained in which it is possible to selectively set whether or not to perform the adjustment of the luminance using the first coefficient and the second coefficient FIG. 24 is an explanatory figure that shows an example of a screen for making a luminance adjustment setting according to the third embodiment of the present invention. The screen that is shown in FIG. 24 is displayed on the panel 158 through the control unit 104, which has a function of a display control portion of the present invention, when the user performs a specified operation with respect to the display device 100 (for example, an issuing of a command by a remote controller to display the setting screen, a pressing of a button that is provided in the main body of the display device 100, or the like). The screen that is shown in FIG. 24 may be displayed in the form of an on-screen display (OSD) that is displayed as an overlay on the image that is displayed based on the video signal, and the screen that is shown in FIG. 24 may also be displayed alone, without the image that is based on the video signal being displayed.

When "Automatic luminance difference adjustment" is selected on the screen that is shown in FIG. 24, the setting of the luminance adjustment is made by one of the three choices "Strong", "Weak", and "Off". If "Strong" is selected, then when the luminance adjustment is performed, the adjusting of the luminance is done using both the first coefficient and the second coefficient. If "Weak" is selected, then when the luminance adjustment is performed, the adjusting of the luminance is done using only the first coefficient. If "Off" is selected, then the adjusting of the luminance by the signal level correction unit 128 (and the signal level collection unit 228) is not performed.

The control unit 104, which has a function of a setting switching portion of the present invention, notifies the signal level correction unit 128 (and the signal level correction unit 228) of the setting through the I/F unit 114. The signal level correction unit 128 (and the signal level correction unit 228) performs the adjustment of the luminance of the image that is displayed on the panel 158 by performing correction of the signal level in accordance with the setting that is has received.

Thus, in the third embodiment of the present invention, it is possible to selectively set whether or not to perform the adjustment of the luminance using the first coefficient and the second coefficient, in accordance with the users wishes. The display device 100 can also determine whether or not to perform the adjustment of the luminance in accordance with the setting that the user has selected.

The preferred embodiments of the present invention have been explained above with reference to the attached drawings, but the present invention is obviously not limited to the examples that have been given. It should be understood by those skilled in the art that various modifications, combinations, sub-combinations and alterations may occur depending on design requirements and other factors insofar as they are within the scope of the appended claims or the equivalents thereof.

For example, in the embodiments that are described above, the risk level map is created by computing the risk levels for all of the pixels, and the gain for reducing the luminance is computed for the one of the pixel and the group of pixels that has the peak value of the risk level, but the present invention is not limited to this example. For example, the risk level map may also be created by computing the risk levels for only a specified area on the screen, and risk level maps may also be created independently for a plurality of areas on the screen.

The invention claimed is:

1. A display device that includes a display in which a plurality of pixels that have light emitting elements that emit light in accordance with an amount of electric current are arranged in the form of a matrix, scanning lines that supply to the pixels, in a specified scan cycle, selection signals that select the pixels that will emit light, and data lines that supply video signals to the pixels, the display device comprising:
   circuitry configured to:
      store data that pertain to amounts of light emission that correspond to a plurality of positions in the display and that are accumulated based on the video signals for a plurality of frames; and
      perform control based on a peak value of the data that pertain to the amounts of light emission and are stored, such that maximum luminances of the video signals that are supplied to the display are restricted,
   wherein the data that pertain to the amounts of light emission that correspond to a plurality of positions in the display include a position of one of one of the pixels and a group of the pixels that includes a plurality of the pixels associated with an amount of light emission parameter,
   wherein, when an amount of light emission of the one of the one of the pixels and the group of the pixels is continuously greater than a specified amount of light emission, the amount of light emission parameter accumulated for the one of the one of the pixels and the group of pixels increases, and
   wherein a point, at which a coefficient begins to diminish, decreases as the amount of light emission parameter accumulated for the one of the one of the pixels and the group of pixels increases, the coefficient used to adjust a luminance of the one of the one of the pixels and the group of pixel.

2. The display device according to claim 1,
   wherein the circuitry is configured to:
      accept as input a video signal that has a linear characteristic and compute the amount of light emission for each of the one of one of the pixels and the group of the pixels,
      compute the amount of light emission parameter that corresponds to the amount of light emission for each of the one of one of the pixels and the group of the pixels based on the amount of light emission that is computed,
      detect a peak value among the amount of light emission parameters that correspond to all of the one of one of the pixels and the group of the pixels and that are stored,
      compute the coefficient that adjusts the luminance based on the peak value that is detected, and
      multiply the video signal by the coefficient that is computed and output the multiplied video signal.

3. The display device according to claim 2,
   wherein the circuitry is configured to compute at least
      a first coefficient that restricts the maximum luminances and
      a second coefficient that restricts a luminance of the one of one of the pixels and the group of the pixels that has the peak value, such that the luminance of the one of one of the pixels and the group of the pixels that has the peak value is less than the luminance of another of the pixels.

4. The display device according to claim 3,
wherein the circuitry is configured to multiply the video signals that are input to all of the pixels by the first coefficient and multiply the video signals that have been multiplied by the first coefficient and that are input to the one of one of the pixels and the group of the pixels that has the peak value by the second coefficient.

5. The display device according to claim 3,
wherein the circuitry is configured to multiply the video signals that are input to all of the pixels except the one of one of the pixels and the group of the pixels that has the peak value by the first coefficient and multiply the video signals that are input to the one of one of the pixels and the group of the pixels that has the peak value by the second coefficient.

6. The display device according to claim 3, wherein the circuitry is further configured to:
switch whether the first coefficient and the second coefficient that are computed are used.

7. The display device according to claim 6, wherein the circuitry is configured to:
cause to be displayed a screen for the switching of whether the first coefficient and the second coefficient are used.

8. The display device according to claim 2, wherein the circuitry is configured to:
switch whether the coefficient that is computed is used.

9. The display device according to claim 8, wherein the circuitry is configured to:
cause to be displayed a screen for the switching of whether the coefficient is used.

10. The display device according to claim 2,
wherein the circuitry is configured to compute the coefficient based on an average value of the amounts of light emission for pixels that are contained in a specified area that surrounds the one of one of the pixels and the group of the pixels that has the peak value.

11. The display device according to claim 2, wherein the circuitry is configured to:
convert a signal that has been multiplied by the coefficient that has a linear characteristic such that it has a gamma characteristic.

12. The display device according to claim 2, wherein the amount of light emission parameter includes a risk level indicating a degree of risk of burn-in corresponding to the one of one of the pixels and the group of the pixels.

13. The display device according to claim 12, wherein the circuitry is configured to compute the risk level by assigning a rank to a range of amount of light emission values.

14. The display device according to claim 13, wherein
the circuitry is configured to compute the risk level by assigning a value to the one of one of the pixels and the group of the pixels based upon the rank, and
the risk level of the one of one of the pixels and the group of the pixels at a specific time is the value of the one of the one of the pixels and the group of the pixels at the specific time.

15. The display device according to claim 14, wherein the risk level of the one of one of the pixels and the group of the pixels at the specific time is the value of the one of the one of the pixels and the group of the pixels at the specific time added to a value of the one of one of the pixels and the group of the pixels at a previous time.

16. The display device according to claim 1, wherein the circuitry is configured to:
convert a video signal that has a gamma characteristic into a video signal that has a linear characteristic.

17. The display device according to claim 1, wherein the amount of light emission parameter includes a risk level.

18. The display device according to claim 17, wherein the risk level indicates a degree of risk of burn-in.

19. A drive method of a display device that includes a display portion in which a plurality of pixels that have light emitting elements that emit light in accordance with an amount of electric current are arranged in the form of a matrix, scanning lines that supply to the pixels, in a specified scan cycle, selection signals that select the pixels that will emit light, and data lines that supply video signals to the pixels, the drive method comprising the steps of:
storing data that pertain to amounts of light emission that correspond to a plurality of positions in the display portion and that are accumulated based on the video signals for a plurality of frames; and
performing control based on a peak value of the stored data that pertain to the amounts of light emission, such that maximum luminances of the video signals that are supplied to the display portion are restricted,
wherein the data that pertain to the amounts of light emission that correspond to a plurality of positions in the display portion include a position of one of one of the pixels and a group of the pixels that includes a plurality of the pixels associated with an amount of light emission parameter,
wherein, when an amount of light emission of the one of the one of the pixels and the group of the pixels is continuously greater than a specified amount of light emission, the amount of light emission parameter accumulated for the one of the one of the pixels and the group of pixels increases, and
wherein a point, at which a coefficient begins to diminish, decreases as the amount of light emission parameter accumulated for the one of the one of the pixels and the group of pixels increases, the coefficient used to adjust a luminance of the one of the one of the pixels and the group of pixel.

20. A non-transitory computer readable medium storing a computer program that causes a computer to perform control of a display device that includes a display portion in which a plurality of pixels that have light emitting elements that emit light in accordance with an amount of electric current are arranged in the form of a matrix, scanning lines that supply to the pixels, in a specified scan cycle, selection signals that select the pixels that will emit light, and data lines that supply video signals to the pixels, the computer program comprising the steps of:
storing data that pertain to amounts of light emission that correspond to a plurality of positions in the display portion and that are accumulated based on the video signals for a plurality of frames; and
performing control based on a peak value of the stored data that pertain to the amounts of light emission, such that maximum luminances of the video signals that are supplied to the display portion are restricted,
wherein the data that pertain to the amounts of light emission that correspond to a plurality of positions in the display portion include a position of one of one of the pixels and a group of the pixels that includes a plurality of the pixels associated with an amount of light emission parameter,
wherein, when an amount of light emission of the one of the one of the pixels and the group of the pixels is continuously greater than a specified amount of light emission, the amount of light emission parameter accumulated for the one of the one of the pixels and the group of pixels increases, and wherein a point, at which a coefficient begins to diminish, decreases as the amount of light emission parameter accumulated for the one of the one of the pixels and the group of pixels increases, the coefficient used to adjust a luminance of the one of the one of the pixels and the group of pixel.

* * * * *